United States Patent
Abdo et al.

(10) Patent No.: US 10,541,659 B2
(45) Date of Patent: Jan. 21, 2020

(54) LOW-NOISE JOSEPHSON JUNCTION-BASED DIRECTIONAL AMPLIFIER

(71) Applicant: Yale University, New Haven, CT (US)

(72) Inventors: Baleegh Abdo, Carmel, NY (US); Katrina Sliwa, New Haven, CT (US); Luigi Frunzio, North Haven, CT (US); Robert J. Schoelkopf, III, Madison, CT (US); Michel Devoret, New Haven, CT (US)

(73) Assignee: Yale University, New Haven, CT (US)

( * ) Notice: Subject to any disclaimer, the term of this patent is extended or adjusted under 35 U.S.C. 154(b) by 15 days.

(21) Appl. No.: 15/029,666

(22) PCT Filed: Oct. 15, 2014

(86) PCT No.: PCT/US2014/060694
§ 371 (c)(1),
(2) Date: Apr. 15, 2016

(87) PCT Pub. No.: WO2015/057839
PCT Pub. Date: Apr. 23, 2015

(65) Prior Publication Data
US 2016/0308502 A1    Oct. 20, 2016

Related U.S. Application Data

(60) Provisional application No. 61/891,226, filed on Oct. 15, 2013.

(51) Int. Cl.
*H03F 7/04*    (2006.01)
*H01L 39/22*    (2006.01)
(Continued)

(52) U.S. Cl.
CPC ............ *H03F 7/04* (2013.01); *H01L 39/223* (2013.01); *H01P 5/18* (2013.01); *H03F 1/26* (2013.01);
(Continued)

(58) Field of Classification Search
CPC . H03F 7/04; H03F 39/223; H03F 1/26; H03F 3/195; H03F 3/608; H03F 7/00; H01P 5/18
(Continued)

(56) References Cited

U.S. PATENT DOCUMENTS 3,275,943 A * 9/1966 Adler ...................... H01J 25/49
                                                   307/424
3,663,886 A * 5/1972 Blume ....................... H03F 7/00
                                                   307/424
(Continued)

FOREIGN PATENT DOCUMENTS

CA    2 470 845 A1    6/2003
EP    0 513 856 A2    11/1992
(Continued)

OTHER PUBLICATIONS

Bergeal et al., "Phase-preserving amplification near the quantum limit with a Josephson ring modulator", Nature Physics, Letters, vol. 465, May 2010. pp. 64-69.*
(Continued)

*Primary Examiner* — Benny T Lee
*Assistant Examiner* — Hafizur Rahman
(74) *Attorney, Agent, or Firm* — Wolf, Greenfield & Sacks, P.C.

(57) ABSTRACT

A low-noise directional amplifier includes a first port, a second port, a first coupler and a second coupler. The first port is coupled to a first coupler. The low-noise directional amplifier also includes at least two phase preserving ampli-
(Continued)

fiers, a first phase preserving amplifier connected to the first coupler and a second coupler, and the second phase preserving amplifier connected to the first coupler and the second coupler.

20 Claims, 10 Drawing Sheets

(51) Int. Cl.
*H01P 5/18* (2006.01)
*H03F 7/00* (2006.01)
*H03F 3/195* (2006.01)
*H03F 3/60* (2006.01)
*H03F 1/26* (2006.01)

(52) U.S. Cl.
CPC ............. *H03F 3/195* (2013.01); *H03F 3/608* (2013.01); *H03F 7/00* (2013.01)

(58) Field of Classification Search
USPC .......................................................... 330/4.5
See application file for complete search history.

(56) References Cited

U.S. PATENT DOCUMENTS

| | | |
|---|---|---|
| 4,344,052 A | 8/1982 | Davidson |
| 4,403,189 A | 9/1983 | Simmonds |
| 4,585,999 A | 4/1986 | Hilbert et al. |
| 4,956,312 A | 9/1990 | Van Laarhoven |
| 5,105,166 A | 4/1992 | Tsukii et al. |
| 5,254,950 A | 10/1993 | Fan et al. |
| 5,326,986 A | 7/1994 | Miller, Jr. et al. |
| 5,493,719 A * | 2/1996 | Smith ................... H01Q 1/364 455/319 |
| 5,582,877 A | 12/1996 | Nagamachi et al. |
| 5,635,834 A | 6/1997 | Sloggett et al. |
| 5,661,494 A | 8/1997 | Bondyopadhyay |
| 5,920,811 A | 7/1999 | Suzuki et al. |
| 6,549,059 B1 | 4/2003 | Johnson |
| 6,578,018 B1 | 6/2003 | Ulyanov |
| 6,621,374 B2 | 9/2003 | Higgins et al. |
| 6,627,915 B1 | 9/2003 | Ustinov et al. |
| 6,635,898 B2 | 10/2003 | Williams et al. |
| 6,822,255 B2 | 11/2004 | Tzalenchuk et al. |
| 6,838,694 B2 | 1/2005 | Esteve et al. |
| 6,900,454 B2 | 5/2005 | Blais et al. |
| 6,911,664 B2 | 6/2005 | Il'ichev et al. |
| 6,943,368 B2 | 9/2005 | Amin et al. |
| 7,042,005 B2 | 5/2006 | Il'ichev et al. |
| 7,129,869 B2 | 10/2006 | Furuta et al. |
| 7,253,654 B2 | 8/2007 | Amin |
| 7,307,275 B2 | 12/2007 | Lidar et al. |
| 7,364,923 B2 | 4/2008 | Lidar et al. |
| 7,369,093 B2 | 5/2008 | Oppenländer et al. |
| 7,443,720 B2 | 10/2008 | Astafiev et al. |
| 7,498,832 B2 | 3/2009 | Baumgardner et al. |
| 7,533,068 B2 | 5/2009 | Maassen van den Brink et al. |
| 7,724,083 B2 | 5/2010 | Herring et al. |
| 7,800,395 B2 | 9/2010 | Johnson et al. |
| 7,876,248 B2 | 1/2011 | Berkley et al. |
| 7,899,092 B2 | 3/2011 | Malinovsky |
| 7,932,515 B2 | 4/2011 | Bunyk |
| 8,032,474 B2 | 10/2011 | Macready et al. |
| 8,106,717 B2 | 1/2012 | Ichimura et al. |
| 8,111,083 B1 | 2/2012 | Pesetski et al. |
| 8,138,784 B2 | 3/2012 | Przybysz et al. |
| 8,179,133 B1 | 5/2012 | Kornev et al. |
| 8,416,109 B2 | 4/2013 | Kirichenko |
| 8,508,280 B2 | 8/2013 | Naaman et al. |
| 8,514,478 B1 | 8/2013 | Spence |
| 8,922,239 B2 | 12/2014 | Pesetski et al. |
| 9,467,126 B1 | 10/2016 | Naaman et al. |
| 9,892,365 B2 | 2/2018 | Rigetti et al. |
| 9,948,254 B2 | 4/2018 | Narla et al. |
| 2001/0025012 A1 | 9/2001 | Tarutani et al. |
| 2002/0188578 A1 | 12/2002 | Amin et al. |
| 2003/0136973 A1 | 7/2003 | Ogawa et al. |
| 2003/0193097 A1 | 10/2003 | Il'ichev et al. |
| 2004/0059760 A1 | 3/2004 | Ageishi et al. |
| 2004/0077503 A1 | 4/2004 | Blais et al. |
| 2004/0140537 A1 | 7/2004 | Il'ichev et al. |
| 2005/0001209 A1 | 1/2005 | Hilton et al. |
| 2005/0117836 A1 | 6/2005 | Franson et al. |
| 2005/0134377 A1 | 6/2005 | Dent |
| 2005/0224784 A1 | 10/2005 | Amin et al. |
| 2006/0097747 A1 | 5/2006 | Amin |
| 2006/0179029 A1 | 8/2006 | Vala et al. |
| 2007/0215862 A1 | 9/2007 | Beausoleil et al. |
| 2007/0296953 A1 | 12/2007 | Allen et al. |
| 2008/0100175 A1 | 5/2008 | Clark |
| 2008/0274898 A1 | 11/2008 | Johnson et al. |
| 2008/0297230 A1 | 12/2008 | Dzurak et al. |
| 2009/0028340 A1 | 1/2009 | Trifonov |
| 2009/0033369 A1 | 2/2009 | Baumgardner et al. |
| 2009/0074355 A1 | 3/2009 | Beausoleil et al. |
| 2009/0153180 A1 | 6/2009 | Herring et al. |
| 2009/0232191 A1 | 9/2009 | Gupta et al. |
| 2009/0258787 A1 | 10/2009 | Wilkie et al. |
| 2009/0289638 A1 | 11/2009 | Farinelli et al. |
| 2010/0241780 A1 | 9/2010 | Friesen |
| 2010/0246152 A1 | 9/2010 | Lin et al. |
| 2011/0060710 A1 | 3/2011 | Amin |
| 2011/0079889 A1 | 4/2011 | Baillin |
| 2012/0074509 A1 | 3/2012 | Berg et al. |
| 2012/0319085 A1 | 12/2012 | Gambetta et al. |
| 2012/0319684 A1 | 12/2012 | Gambetta et al. |
| 2012/0326130 A1 | 12/2012 | Maekawa et al. |
| 2012/0326720 A1 | 12/2012 | Gambetta et al. |
| 2013/0029848 A1 | 1/2013 | Gonzalez et al. |
| 2013/0043945 A1 | 2/2013 | McDermott et al. |
| 2013/0107352 A1 | 5/2013 | Santori et al. |
| 2013/0196855 A1 | 8/2013 | Poletto et al. |
| 2013/0271265 A1 | 10/2013 | Finn |
| 2014/0167836 A1 | 6/2014 | Gambetta et al. |
| 2014/0314419 A1 | 10/2014 | Paik |
| 2015/0241481 A1 | 8/2015 | Narla et al. |
| 2017/0039481 A1 | 2/2017 | Abdo |
| 2018/0040935 A1 | 2/2018 | Sliwa et al. |
| 2018/0054165 A1 | 2/2018 | Szocs et al. |
| 2018/0138987 A1 | 5/2018 | Sliwa et al. |
| 2018/0198427 A1 | 7/2018 | Narla et al. |
| 2019/0020346 A1 | 1/2019 | Wang et al. |
| 2019/0190474 A1 | 6/2019 | Abdo et al. |

FOREIGN PATENT DOCUMENTS

| | | | |
|---|---|---|---|
| EP | 2 249 173 | A1 | 11/2010 |
| EP | 2 264 799 | A1 | 12/2010 |
| GB | 1 370 647 | A | 10/1974 |
| JP | 2-924421 | B2 | 7/1999 |
| JP | 2006-344761 | A | 12/2006 |
| RU | 2 106 717 | C1 | 3/1998 |
| RU | 2 212 671 | C1 | 9/2003 |
| RU | 2010 124 198 | A | 12/2011 |
| WO | WO 2017/065856 | A1 | 4/2017 |

OTHER PUBLICATIONS

International Search Report and Written Opinion dated Apr. 2, 2015 for Application No. PCT/US2014/060694.
International Preliminary Report on Patentability dated Apr. 28, 2016 for Application No. PCT/US2014/060694.
Abdo et al., Full coherent frequency conversion between two propagating microwave modes. Phys Rev Lett. Apr. 26, 2013;110:173902.1-5. doi: 10.1103/PhysRevLett.110.173902.
Abdo et al., Josephson directional amplifier for quantum measurement of superconducting circuits. Phys Rev Lett. Apr. 25, 2014;112:167701.1-5. doi: 10.1103/PhysRevLett.112.167701.
Abdo et al., Nondegenerate three-wave mixing with the Josephson ring modulator. Phys Rev B. Jan. 16, 2013;87(1):014508.1-18. doi: 10.1103/PhysRevB.87.014508.

(56) References Cited

OTHER PUBLICATIONS

Albert et al., Holonomic quantum computing with cat-codes. Apr. 10, 2015. arXiv:1503.00194v2. 5 pages.
Albert et al., Symmetries and conserved quantities in Lindblad master equations. Phys Rev A. Feb. 2014;89(2):022118. arXiv:1310.1523v2. 15 pages.
Bergeal et al., Phase-preserving amplification near the quantum limit with a Josephson ring modulator. Nature. May 2010;465(7294):64-8. arXiv:0912.3407v1. 20 pages.
Burgarth et al., Non-Abelian phases from quantum Zeno dynamics. Phys Rev A. Oct. 9, 2013;88:042107.1-5. doi: 10.1103/PhysRevA.88.042107.
Campagne-Ibarcq et al., Persistent control of a superconducting qubit by stroboscopic measurement feedback. Phys Rev X. 2013;3:1-7. arXiv:1301.6095v2.
Carollo et al., Coherent Quantum Evolution via Reservoir Driven Holonomy. Phys Rev Lett. Jan. 18, 2006;96;020403. arXiv:quant-ph/0507229v2. 4 pages.
Carollo et al., Geometric Phase Induced by a Cyclically Evolving Squeezed Vacuum Reservoir. Phys Rev Lett. Apr. 21, 2006;96:150403. arXiv:quant-ph/0507101v2. 5 pages.
Castellanos-Beltran et al., Amplification and squeezing of quantum noise with a tunable Josephson metamaterial. Nat Phys. Dec. 2008;4(12):928-31.
Chaturvedi et al., Berry's phase for coherent states. J Phys A: Math Gen. 1987;20(16):L1071-5.
Dasgupta et al., Decoherence-induced geometric phase in a multi-level atomic system. J Phys B: At Mol Opt Phys. Apr. 18, 2007;40(9):S127. arXiv:quant-ph/0612201v1. 10 pages.
De Ponte et al., Relaxation- and decoherence-free subspaces in networks of weakly and strongly coupled resonators. Ann Phys. Mar. 12, 2007;322:2077-84.
Devoret et al., Error-Corrected Quantum Registers for a Modular Superconducting Quantum Computer. Yale White Paper: ARO/LPS. Yale University, Departments of Applied Physics and Physics. Jan. 11, 2013. 56 pages.
Devoret et al., Superconducting Circuits for Quantum Information: An Outlook. Science. Mar. 8, 2013;339:1169-74. doi: 10.1126/science.1231930.
Duan et al., Preserving Coherence in Quantum Computation by Pairing Quantum Bits. Phys Rev Lett. Sep. 8, 1997;79(10-8):1953-6.
Eichler et al., Controlling the dynamic range of a Josephson parametric amplifier. EPJ Quantum Tech. Jan. 29, 2014;1(2). doi:10.1140/epjqt2. 19 pages.
Facchi et al., Quantum Zeno Subspaces. Phys Rev Lett. Aug. 19, 2002;89(8):080401.1-4.
Heeres et al., Cavity State Manipulation Using Photon-Number Selective Phase Gates. Phys Rev Lett. Sep. 25, 2015;115:137002.1-5. doi: 10.1103/PhysRevLett.115.137002.
Hofheinz et al., Synthesizing arbitrary quantum states in a superconducting resonator. Nature. May 28, 2009;459:546-9. doi:10.1038/nature08005. Supplementary Information. 6 pages.
Hover et al., High fidelity qubit readout with the superconducting lowinductance undulatory galvanometer microwave amplifier. Appl Phys Lett. 2014;104;152601.1-4.
Hover et al., Superconducting Low-inductance Undulatory Galvanometer Microwave Amplifier. Appl Phys Lett. Feb. 7, 2012;100:063503.1-3.
Johnson et al., Dispersive readout of a flux qubit at the single photon level. Phys Rev B. 2011;84:220503. arXiv:1109.2858v2. 5 pages.
Kamal et al., Gain, directionality, and noise in microwave SQUID amplifiers: Input-output approach. Phys Rev B. 2012;86:144510.1-12. doi: 10.1103/PhysRevB.86.144510.
Kerckhoff et al., On-chip superconducting microwave circulator from synthetic rotation. Phys Rev Appl. 2015;4:034002. arXiv:1502.06041. Submitted Feb. 21, 2015. 13 pages.
Kirchmair et al., Observation of quantum state collapse and revival due to the single-photon Kerr effect. Nature. Mar. 14, 2013;495:205-9. doi:10.1038/nature11902.

Knill et al., Theory of Quantum Error Correction for General Noise. Phys Rev Lett. Mar. 13, 2000;84(11):2525-8. arXiv:quant-ph/9908066v1. 6 pages.
Krastanov et al., Universal Control of an Oscillator with Dispersive Coupling to a Qubit. Phys Rev A. 2015;92:040303. arXiv:1502.08015. Submitted Feb. 27, 2015. 5 pages.
Leghtas et al., Confining the state of light to a quantum manifold by engineered two-photon loss. Dec. 16, 2014. arXiv:1412.4633v1. 29 pages.
Lidar et al., Decoherence Free Subspaces for Quantum Computation. Phys Rev Lett. Sep. 21, 1998;81(12):2594-7. arXiv:quant-ph/9807004v2. 4 pages.
Lindblad, On the generators of quantum dynamical semigroups. Commun Math Phys. 1976;48(2):119-30.
Minev et al., Planar Superconducting Whispering Gallery Mode Resonators. Appl Phys Lett. Oct. 3, 2013;103:142604.1-3. doi: 10.1063/1.4824201.
Mirrahimi et al., Dynamically protected cat-qubits: a new paradigm for universal quantum computation. New J Phys. Apr. 22, 2014;16:045014. 31 pages.
Mousolou et al., Universal non-adiabatic holonomic gates in quantum dots and single-molecule magnets. New J Phys. Jan. 17, 2014;16:013029. 10 pages.
Mück et al., Superconducting Quantum Interference Device as a Near-Quantum-Limited Amplifier at 0.5 GHz. Appl Phys Lett. Feb. 12, 2001;78(7):967-9. doi: 10.1063/1.1347384.
Narla et al., Wireless Josephson amplifier. Appl Phys Lett. 2014;104:232605. doi: 10.1063/1.4883373. 6 pages.
O'Brien et al., Resonant Phase Matching of Josephson Junction Traveling Wave Parametric Amplifiers. Phys Rev Lett. Oct. 10, 2014;113:157001.1-5.
Oreshkov et al., Adiabatic Markovian Dynamics. Phys Rev Lett. Jul. 30, 2010;105(5):050503. arXiv:1002.2219v4. 7 pages.
Oreshkov et al., Fault-Tolerant Holonomic Quantum Computation. Phys Rev Lett. Feb. 20, 2009;102:070502.1-4.
Oreshkov, Holonomic Quantum Computation in Subsystems. Phys Rev Lett. Aug. 28, 2009;103(9):090502. arXiv:0905.1249v3. 5 pages.
Pachos et al., Decoherence-free dynamical and geometrical entangling phase gates. Phys Rev A. 2004;69:033817. arXiv:quant-ph/0309180v3. 10 pages.
Paik et al., Observation of High Coherence in Josephson Junction Qubits Measured in a Three-Dimensional Circuit QED Architecture. Phys Rev Lett. Dec. 5, 2011;107(24):240501. arXiv:1105.4652v4. 5 pages.
Paz-Silva et al., Zeno Effect for Quantum Computation and Control. Phys Rev Lett. Feb. 24, 2012;108(8):080501. arXiv:1104.5507v2. 7 pages.
Pillet et al., Optimal design for the Josephson mixer. Mar. 30, 2015. arXiv:1503.08185v1. 5 pages.
Ranzani et al., Graph-based analysis of nonreciprocity in coupled-mode systems. New J Phys. Oct. 15, 2014;17:023024. arXiv 2014;1406.4922v2. 21 pages.
Ristè et al., Feedback Control of a Solid-State Qubit Using High-Fidelity Projective Measurement. Phys Rev Lett. Dec. 2012;109(24):240502. arXiv:1207.2944v1 [cond-mat.mes-hall]. 9 pages.
Roch et al., Observation of measurement-induced entanglement and quantum trajectories of remote superconducting qubits. Phys Rev Lett. May 2, 2014;112:170501.1-5.
Roch et al., Widely Tunable, Non-degenerate Three-Wave Mixing Microwave Device Operating near the Quantum Limit. Phys Rev Lett. Apr. 2012;108(14):147701. arXiv:1202.1315v1 [cond-mat.mes-hall]. 5 pages.
Sarandy et al., Abelian and non-Abelian geometric phases in adiabatic open quantum systems. Phys Rev A. Jun. 2006;73(6):062101. arXiv:quant-ph/0507012v3. 10 pages.
Schindler et al., Quantum simulation of open-system dynamical maps with trapped ions. Nature Phys. May 19, 2013;9:361-7. arXiv:1212.2418v1. 28 pages.

(56) References Cited

OTHER PUBLICATIONS

Schoelkopf, Error-Corrected Quantum Registers for a Modular Superconducting Quantum Computer. Yale White Paper for ARO/LPS. Department of Applied Physics and Physics. Jan. 7, 2013. 53 pages.
Siddiqi et al., An RF-Driven Josephson Bifurcation Amplifier for Quantum Measurements. Phys Rev Lett. Nov. 10, 2004;93:207002. arXiv:cond-mat/0312623v1. 4 pages.
Sjöqvist, Trends: A new phase in quantum computation. Phys. 2008;1:35. doi: 10.1103/Physics.1.35. 6 pages.
Spietz et al., Input Impedance and Gain of a Gigahertz Amplifier Using a DC SQUID in a Quarter Wave Resonator. Appl Phys Lett. Jun. 17, 2008;93:082506. arXiv:0806.2853v1. 4 pages.
Vijay et al., Observation of Quantum Jumps in a Superconducting Artificial Atom. Phys Rev Lett. Mar. 18, 2011;106(11):110502.1-4.
Wu et al., Time-dependent decoherence-free subspace. J Phys A: Math. Theor. Sep. 19, 2012;45(40):405305. arXiv:1205.1298v2. 7 pages.
Xu et al., Non-Adiabatic Holonomic Quantum Computation in Decoherence-Free Subspaces. Phys Rev Lett. Oct. 24, 2012;109(17):170501. arXiv:1210.6782v1. 4 pages.
Xu et al., Universal Nonadiabatic Geometric Gates in Two-Qubit Decoherence-Free Subspaces. Sci Rep. Oct. 29, 2014;4:6814. doi: 10.1038/srep06814. 5 pages.
Yaakobi et al., Parametric amplification in Josephson junction embedded transmission lines. Phys Rev B. Apr. 1, 2013;87:144301. 1-9. doi: 10.1103/PhysRevB.87.144301.
Zanardi et al., Coherent quantum dynamics in steady-state manifolds of strongly dissipative systems. Phys Rev Lett. Dec. 17, 2014;113:240406. arXiv:1404.4673. 6 pages.
Zanardi et al., Geometry, robustness, and emerging unitarity in dissipation-projected dynamics. Phys Rev A. 2015;91:052324. arXiv:1412.6198. 8 pages.
Zanardi et al., Holonomic Quantum Computation. Phys Lett A. Nov. 15, 1999;264:94-9. 5 pages.
Zanardi et al., Noiseless Quantum Codes. Phys Rev Lett. Oct. 27, 1997;79(17):3306-9. arXiv:quant-ph/9705044v2. 4 pages.
Zanardi, Stabilizing Quantum Information. Phys Rev A. Dec. 5, 2000;63(1):012301. arXiv:quant-ph/9910016v2. 5 pages.
Zanardi, Virtual Quantum Subsystems. Phys Rev Lett. Aug. 13, 2001;87(7):077901. arXiv:quant-ph/0103030v2. 4 pages.
Zhang et al., Physical implementation of holonomic quantum computation in decoherence-free subspaces with trapped ions. Phys Rev A. 2006;74:034302. arXiv:quant-ph/0608068v1. 4 pages.
Zheng, Dissipation-induced geometric phase for an atom in cavity QED. Phys Rev A. May 10, 2012;85(5):052106. arXiv:1205.0984v2. 7 pages.
Zheng, Open-system geometric phase based on system-reservoir joint state evolution. Phys Rev A. Jun. 27, 2014;89:062118. arXiv:1405.1227v1. 8 pages.
Zhu et al., Geometric quantum gates robust against stochastic control errors. Phys Rev A. Aug. 15, 2005;72(2):020301. arXiv:quant-ph/0407177v1. 4 pages.
Partial Supplementary European Search Report dated Mar. 29, 2017 for Application No. EP 14854592.4.
Houck et al., Life after charge noise: recent results with transmon qubits. Quantum Info Process. Feb. 11, 2009;8(2-3):105-15.
Bergeal et al., Analog information processing at the quantum limit with a Josephson ring modulator. Nat Phys. Apr. 2010;6(4):296-302. doi: 10.1038/NPHYS1516. Epub Feb. 14, 2010. 7 pages.
Koch et al., Time-reversal symmetry breaking in circuit-QED based photon lattices. arXiv:1006.0762v2. Oct. 11, 2010. 19 pages.
Platenberg, Coupled superconducting flux qubits. Delft University of Technology. Thesis. 2007. 153 pages.
Wang, Memristors and Superconducting Quantum Interference Filters in RF Systems. Department of Electrical and Computer Engineering, Duke University. Thesis. Aug. 18, 2014. 119 pages.
Wendin et al., Superconducting quantum circuits, qubits and computing. arXiv:cond-mat/0508729v1. Aug. 30, 2005. 60 pages.
U.S. Appl. No. 16/160,897, filed Oct. 15, 2018, Abdo et al.

U.S. Appl. No. 15/914,995, filed Mar. 7, 2018, Narla et al.
U.S. Appl. No. 15/553,030, filed Aug. 23, 2017, Szöcs et al.
U.S. Appl. No. 15/553,041, filed Aug. 23, 2017, Sliwa et al.
U.S. Appl. No. 15/567,198, filed Oct. 17, 2017, Sliwa et al.
U.S. Appl. No. 16/068,405, filed Jul. 6, 2018, Wang et al.
EP 14854592.4, dated Aug. 10, 2017, Extended European Search Report.
EP 14854592.4, dated Jul. 6, 2018, European Communication.
SG 11201602942U, dated Sep. 24, 2018, Supplementary Examination Report.
Extended European Search Report for European Application No. EP 14854592.4 dated Aug. 10, 2017.
European Communication for European Application No. 14854592.4 dated Jul. 6, 2018.
Supplementary Examination Report for Singapore Application No. 11201602942U dated Sep. 24, 2018.
Castellanos-Beltran et al., Widely tunable parametric amplifier based on a superconducting quantum interference device array resonator. Applied Physics Letters. 2007;91(8). 4 pages.
Pasi et al., Advanced Concepts in Josephson Junction Reflection Amplifiers, Journal of Low Temperature Physics. 2014;175(5-6):868-76.
Pillet, Amplification, entanglement and storage of microwave radiation using superconducting circuits. University of Virginia. Seminar. 2014;1-78.
Schackert et al., A Practical Quantum-Limited Parametric Amplifier Based on the Josephson Ring Modulator. A Dissertation Presented to the Faculty of the Graduate School of Yale University in Candidacy for the Degree of Doctor of Philosophy. Dec. 2013.
Schackert et al., Phase-preserving amplification near the quantum limit with a Josephson ring modulator. Nature. May 2010;465(7294):64-8. arXiv:0912.3407v1. 20 pages.
Zhou et al., High-gain weakly nonlinear flux-modulated Josephson parametric amplifier using a SQUID array. Physical Review, 2014;89(21). 6 pages.
Zueco et al,. Qubit-oscillator dynamics in the dispersive regime: analytical theory beyond the rotating-wave approximation. Physical Review A 80.3 2009. 6 pages.
Extended European Search Report for European Application No. 17739044.0, dated Jul. 19, 2019.
Bianchetti et al., Dynamics of dispersive single qubit read-out in circuit quantum electrodynamics. Phys. Rev. A. Oct. 30, 2009;80:043840.
Govenius et al., Parity of measurement of remote qubits using dispersive coupling and photodetection. Phys. Rev. A. Oct. 1, 2015;92(4):042305.
Shafer, Balanced Amplifier IP3 Improvement. Wayback Machine archive of RF Café, first saved Dec. 5, 2008. https://web.archive.org/web/20081205031826/www.rfcafe.com/references/electrical/balanced-amplifier-ip3-improvement.htm, 2 pages.
Extended European Search Report for European Application No. EP 16756465.7 dated Sep. 28, 2018.
International Search Report and Written Opinion for International Application No. PCT/US2016/019821 dated May 6, 2016.
International Preliminary Report on Patentability for International Application No. PCT/US2016/019821 dated Sep. 8, 2017.
Extended European Search Report for European Application No. EP 16756463.2 dated Sep. 7, 2018.
International Search Report and Written Opinion for International Application No. PCT/US2016/019819 dated May 3, 2016.
International Preliminary Report on Patentability for International Application No. PCT/US2016/019819 dated Sep. 8, 2017.
Extended European Search Report for European Application No. 16780864.1, dated Mar. 5, 2019.
Invitation to Pay Additional Fees for International Application No. PCT/US2016/027817 dated Jun. 3, 2016.
International Search Report and Written Opinion for International Application No. PCT/US2016/027817 dated Aug. 22, 2016.
Hatridge et al., Quantum back-action of an individual variable-strength measurement. Science. Jan. 11, 2013; 339(6116): 178-81. doi: 10.1126/science.1226897.
Ho Eom et al., A wideband, low-noise superconducting amplifier with high dynamic range. Nature Physics. 2012;8(8):623-7.

(56) References Cited

OTHER PUBLICATIONS

Kamal et al., Noiseless nonreciprocity in a parametric active device. Nature Physics. 2011;7:311-315.

Kamal et al., Signal-to-pump back action and self-oscillation in double-pump Josephson parametric amplifier. Phys. Rev. B. May 13, 2009;79:184301.

Liu et al., Comparing and combining measurement-based and driven-dissipative entanglement stabilization. Phys. Rev. X. 2016;6:011022.

Macleod et al., Periodicity in Al/Ti superconducting single electron transistors. App Phys Lett. Aug. 3, 2009;95:052503.

Martinis et al., Calculation of Tc in a normal-superconductor bilayer using the microscopic-based Usadel theory. Nucl Instrum Methods Phys Res A. 2000;444(1)2:23-27.

Martinis et al., Energy decay in superconducting Josephson-Junction qubits from nonequilibrium quasiparticle excitations. Phys Rev Lett. 2009;103(9):097002.

Metelmann et al., Nonreciprocal photon transmission and amplification via reservoir engineering. Phys. Rev. X. 2015(5):021025.

Murch et al., Observing single quantum trajectories of a superconducting quantum bit. Nature. Oct. 10, 2013;502(7470):211-4. doi: 10.1038/nature12539.

Mutus et al., Design and characterization of a lumped element single-ended superconducting microwave parametric amplifier with on-chip flux bias line. App Phys Lett. Sep. 17, 2013;103:122602.

Narla et al., Robust concurrent remote entanglement between two superconducting qubits. Phys Rev X. 2016;6:031036.

Nsanzineza et al., Trapping a single vortex and reducing quasiparticles in a superconducting resonator. Phys Rev Lett. Sep. 12, 2014;113(11): 117002. Epub Sep. 12, 2014.

Ofek et al., Demonstrating quantum error correction that extends the lifetime of quantum information. Nature. 2016;536:441-445.

Peltonen et al., Magnetic-field-induced stabilization of nonequilibrium superconductivity in a normal-metal/insulator/superconductor junction. Phys Rev B. 2011;84(22):220502.

Pop et al., Coherent suppression of electromagnetic dissipation due to superconducting quasiparticles. Nature. Apr. 17, 2014;508(7496):369-72. doi: 10.1038/nature13017.

Rigetti et al., Superconducting qubit in a waveguide cavity with a coherence time approaching 0.1 ms. Phys Rev B. 2012;86:100506.

Risté et al., Millisecond charge-parity fluctuations and induced decoherence in a superconducting transmon qubit. Nat Commun. 2013;4:1913. doi: 10.1038/ncomms2936.

Segall et al., Dynamics and energy distribution of nonequilibrium quasiparticles in superconducting tunnel junctions. Physical Review B. 2004;70(21):214520.

Shankar et al., Autonomously stabilized entanglement between two superconducting quantum bits. Nature. Dec. 19, 2013;504(7480):419-22. doi:10.1038/nature12802. Epub Nov. 24, 2013.

Shaw et al., Kinetics of nonequilibrium quasiparticle tunneling in superconducting charge qubits. Phys Rev B. Jul. 1, 2008;78:024503.

International Preliminary Report on Patentability for International Application No. PCT/US2016/027817 dated Oct. 26, 2017.

International Search Report and Written Opinion for International Application No. PCT/US2017/013426 dated Apr. 5, 2017.

International Preliminary Report on Patentability for International Application No. PCT/US2017/013426 dated Jul. 26, 2018.

International Search Report and Written Opinion for International Application No. PCT/US2018/064922, dated Mar. 8, 2019.

Abdo et al., Josephson amplifier for qubit readout. Appl Phys Lett. 2011; 99(16): 162506. doi: 10.1063/1.3653473.

Araujo et al., A LEKID-based CMB instrument design for large-scale observations in Greenland. Proc of SPIE—The International Society for Optical Engineering. Aug. 4, 2014;9153:91530W. doi: 10.1117/12.2056828.

Barends et al., Minimizing quasiparticle generation from stray infrared light in superconducting quantum circuits, Appl Phys Lett. Sep. 13, 2011;99(11):113507.

Bockstiegel et al., Development of broadband NbTiN traveling wave parametric amplifier for MKID readout. J Low Temp Phys. 2014;176:476-82.

Campagne-Ibarcq et al., Observing quantum state diffusion by heterodyne detection of fluorescence. Phys Rev X. 2016;6:011002.

Catelani et al., Relaxation and frequency shifts induced by quasiparticles in superconducting qubits, Phys Rev B. 2011;84(6) 064517.

Caves, Quantum limits on noise in linear amplifiers. Phys. Rev. D. 1982;26(8):1817-39.

Corcoles et al., Protecting superconducting qubits from radiation. App Phys Lett. 2011;99(18):181906.

Court et al., Quantitative study of quasiparticle traps using the single-Cooper-pair transistor. Phys Rev B. 2008;77(10):100501.

De Lange et al., Reversing quantum trajectories with analog feedback. Phys Rev Lett. 2014;112:080501.

Dolan, Offset masks for lift-off photoprocessing. App Phys Lett. 1977;31(5):337-9.

Flurin et al., Superconducting quantum node for entanglement and storage of microwave radiation. Phys Rev Lett. Mar. 6, 2015;114(9):090503. Epub Mar. 4, 2015.

Flurin et al., Generating entangled microwave radiation over two transmission lines. Phys Rev Lett. Nov. 2, 2012;109(18):183901. Epub Oct. 31, 2012.

Frattini et al., 3-wave mixing Josephson dipole element. App Phys Lett. 2017;110:222603-4.

Friedrich et al., Experimental quasiparticle dynamics in a superconducting, imaging x-ray spectrometer, App Phys Lett. 1997;71(26):3901.

Golubov et al., Quasiparticle lifetimes and tunneling times in a superconductor-insulator-superconductor tunnel junction with spatially inhomogeneous electrodes. Phys Rev B Condens Matter. May 1, 1994;49(18):12953-68.

Gueron, Quasiparticles in a diffusive conductor: interaction and pairing, Universite Pierre et Marie Curie—Paris VI. 1997, 241 pages.

Hatridge et al., Dispersive magnetometry with a quantum limited SQUID parametric amplifier. Phys Rev B. Apr. 2011;83(13):134501-1-8.

Silveri et al., Theory of remote entagement via quantum limited phase-preserving amplification. Phys Rev A. Jun. 7, 2016;93:062310.

Sirois et al., Coherent-state storage and retrieval between superconducting cavities using parametric frequency conversion. Appl Phys Lett. Apr. 30, 2015;106:172603.

Sliwa et al., Reconfigurable Josephson Circulator/Directional Amplifier. Phys. Rev. X 2015;5:041020.

Smith et al., Low noise papametric amplifier. IEEE Transactions on Magnetics. Mar. 1985;MAG-21(2):1022-8.

Sun et al., Measurements of Quasiparticle Tunneling Dynamics in a Band-Gap-Engineered Transmon Qubit. Phys Rev Lett. Jun. 8, 2012;108:230509. doi: 10.1103/PhysRevLett.108.230509.

Sun et al., Tracking photon jumps with repeated quantum non-demolition parity measurements. Nature. Jul. 24, 2014;511(7510):444-8. doi: 10.1038/nature13436. Epub Jul. 13, 2014.

Swenson et al., High-speed phonon imaging using frequency-multiplexed kinetic inductance detectors,. App Phys Lett. Jul. 1, 2010; 96:263511.

Usadel, Generalized Diffusion Equation for Superconducting Alloys. Phys Rev Lett. 1970;25(8):507.

Vijay et al., Invited Review Article: The Josephson bifurcation amplifier. Rev Sci Instrum. Nov. 17, 2009;80:111101. doi:10.1063/1.3224703.

Vijay et al., Quantum feedback control of a superconducting qubit: Persistent Rabi oscillations. Nature. Oct. 4, 2012;490(7418):77-80. doi: 10.1038/nature11505.

Vion et al., Manipulating the quantum state of an electrical circuit. Science. May 3, 2002;296(5569):886-9.

Visser et al., Fluctuations in the electron system of a superconductor exposed to a photon flux. Nat Commun. 2014;5:3130. doi: 10.1038/ncomms4130.

Vool et al., Non-Poissonian quantum jumps of a fluxonium qubit due to quasiparticle excitations. Phys Rev Lett. Dec. 12, 2014;113(24):247001. Epub Dec. 8, 2014.

Wang et al., A Schrödiner cat living in two boxes. Science. May 27, 2016;352(6289):1087.

(56) References Cited

OTHER PUBLICATIONS

Wang et al., Measurement and control of quasiparticle dynamics in a superconducting qubit, Nature Comms. Dec. 18, 2014; 5:5836. doi:10.1038/ncomms6836.
Wenner et al., Excitation of superconducting qubits from hot nonequilibrium quasiparticles. Phys Rev Lett. Apr. 12, 2013;110(15):150502. Epub Apr. 9, 2013.
Yamamoto et al., Flux-driven Josephson parametric amplifier. Appl Phys Lett Jul. 2008;93:042510. doi:10.1063/1.2964182.
Zhong et al., Squeezing with a flux-driven Josephson parametric amplifier. New J Phys. Dec. 2013;15:125013. doi:10.1088/1367-2630/15/12/125013.
Zorin, Josephson Traveling-Wave Parametric Amplifier with Three-Wave Mixing. Phys Rev Applied. Sep. 12, 2016;6:034006.
EP 16756465.7, dated Sep. 28, 2018, Extended European Search Report.
PCT/US2016/019821, dated May 6, 2016, International Search Report and Written Opinion.
PCT/US2016/019821, dated Sep. 8, 2017, International Preliminary Report on Patentability.
EP 16756463.2, dated Sep. 7, 2018, Extended European Search Report.
PCT/US2016/019819, dated May 3, 2016, International Search Report and Written Opinion.
PCT/US2016/019819, dated Sep. 8, 2017, International Preliminary Report on Patentability.
EP16780864.1, dated Mar. 5, 2019, Extended European Search Report.
PCT/US2016/027817, dated Jun. 3, 2016, Invitation to Pay Additional Fees.
PCT/US2016/027817, dated Aug. 22, 2016, International Search Report and Written Opinion.
PCT/US2016/027817, dated Oct. 26, 2017, International Preliminary Report on Patentability.
PCT/US2017/013426, dated Apr. 5, 2017, International Search Report and Written Opinion.
PCT/US2017/013426, dated Jul. 26, 2018, International Preliminary Report on Patentability.
PCT/US2018/064922, dated Mar. 8, 2019, International Search Report and Written Opinion.

\* cited by examiner

LOW-NOISE JOSEPHSON JUNCTION-BASED DIRECTIONAL AMPLIFIER

CROSS REFERENCE TO RELATED APPLICATIONS

This application is a national stage filing under 35 U.S.C. § 371 of international application number PCT/US2014/060694, filed Oct. 15, 2014, which claims the benefit of U.S. provisional application Ser. No. 61/891,226, entitled "LOW-NOISE JOSEPHSON JUNCTION-BASED DIRECTIONAL AMPLIFIER," filed Oct. 15, 2013, each of which is herein incorporated by reference in its entirety.

GOVERNMENT SUPPORT

This invention was made with government support under W911NF-09-01-0514 awarded by The United States Army Research Office. The government has certain rights in the invention.

BACKGROUND

Quantum information processing uses quantum mechanical properties to extend the capabilities of information processing. For example, security of information transfer may be enhanced, the amount of information encoded in a communication channel may be increased, and the number of operations required to perform certain computations may be reduced. Just as in conventional information processing where information is stored in one or more bits, quantum information is stored in one or more quantum bits, known as "qubits." A qubit may be implemented physically in any two-state quantum mechanical system, such as photon polarization, electron spin, nuclear spin, or various properties of a superconducting Josephson junction, such as charge, energy, or the direction of a current.

One type of qubit based on the plasma oscillation of a superconducting Josephson junction is a circuit known as a "transmon." Operations on a transmon, such as quantum state initialization, quantum gate operations and quantum measurements, may be implemented by transmitting and receiving microwave photons with the transmon. Microwave photon detectors are used to measure the photons received from the transmon and it would be desirable to provide the detection with high quantum efficiency and low noise.

SUMMARY

The following is a non-limiting summary of some embodiments of the present application.

Some embodiments are directed to a low-noise directional amplifier that includes a first port and a second port; a first coupler and a second coupler, wherein the first port and the second port are coupled to the first coupler; a first phase preserving amplifier connected to the first coupler and the second coupler; and a second phase preserving amplifier connected to the first coupler and the second coupler.

In some embodiments, the first port is an input port configured to receive at least one input signal and the second port is an output port configured to output at least one signal.

In some embodiments, low-noise directional amplifier also includes a third port coupled to a cold load and a fourth port coupled to a cold load.

In some embodiments the low-noise directional amplifier comprises fewer than four ports.

In some embodiments, the first coupler is a 3 dB coupler.

In some embodiments, a reflection gain amplitude of the first phase preserving amplifier is the same as a reflection gain amplitude of the second phase preserving amplifier and a transmission gain amplitude is the same as a transmission gain amplitude of the second phase preserving amplifier.

In some embodiments, the reflection gain amplitude of the first phase preserving amplifier is greater than or equal to unity and less than the reciprocal of a transmission amplitude of the second coupler.

In some embodiments, the first phase preserving amplifier and the second phased preserving amplifier are each a Josephson Parametric Converter (JPC).

In some embodiments, a phase of a pump signal of the first phase preserving amplifier is different from a phase of a pump signal of the second phase preserving amplifier.

In some embodiments, the difference between the phase of the pump signal of the first phase preserving amplifier and the phase of the pump signal of the second phase preserving amplifier is pi divided by two radians.

In some embodiments, the difference between the phase of the pump signal of the first phase preserving amplifier and the phase of the pump signal of the second phase preserving amplifier determines whether the low-noise directional amplifier is non-reciprocal.

In some embodiments, a transmission of a signal from the first port to the second port is substantially 100% when no pumps are applied to the first phase preserving amplifier and the second phase preserving amplifier.

In some embodiments, the low-noise directional amplifier is non-reciprocal and does not include a circulator.

In some embodiments, the low-noise directional amplifier is at least part of an integrated circuit.

Some embodiments are directed to an integrated circuit that includes a low-noise directional amplifier and a qubit coupled to the low-noise directional amplifier such that the low-noise directional amplifier is configured to measure a state of the qubit. The low-noise directional amplifier includes a first port and a second port; a first coupler and a second coupler, wherein the first port and the second port are coupled to the first coupler; a first phase preserving amplifier connected to the first coupler and the second coupler; and a second phase preserving amplifier connected to the first coupler and the second coupler.

In some embodiments, the low-noise directional amplifier is configured to measure the state of the qubit at the quantum noise limit.

In some embodiments, the qubit is one of a plurality of qubits; and the low-noise directional amplifier is one of a plurality of low-noise directional amplifiers, each low-noise directional amplifier of the plurality of low-noise directional amplifiers connected to at least one of the plurality of qubits.

Some embodiments are directed to a method of amplifying a microwave signal. The method includes acts of: receiving the signal at an input port of a directional amplifier; amplifying at least a portion of the signal using both a first parametric amplifier and a second parametric amplifier to create an amplified signal; and transmitting the amplified signal out an output port of the directional amplifier.

In some embodiments, the method further includes act an act of splitting the signal into at least two portions prior to the act of amplifying.

In some embodiments, the first parametric amplifier is pumped using a first microwave pump with a first phase; and the second parametric amplifier is pumped using a second microwave pump with a second phase, wherein the different between the first phase and the second phase is pi/2 radians.

The features and advantages of the present invention will be more readily understood and apparent from the following detailed description, which should be read in conjunction with the accompanying drawings, and from the claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
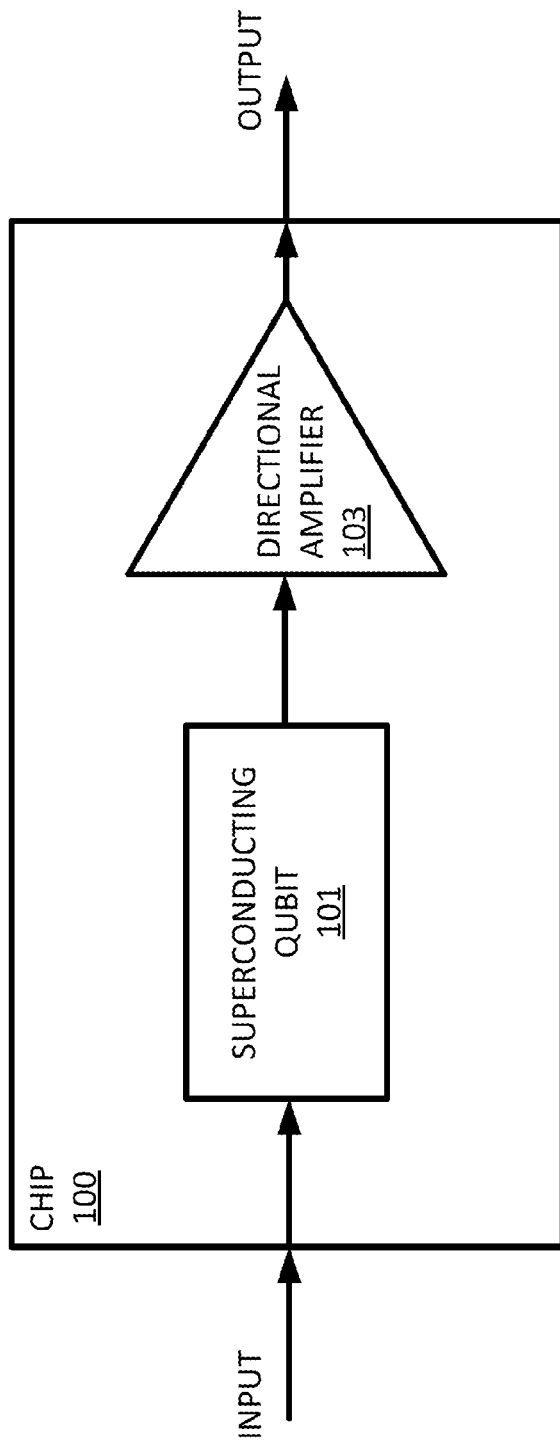
FIG. 1 shows a schematic of an integrated circuit according to some embodiments.

Conventional dispersive electronic circuits, such as those formed from capacitors and inductors, are reciprocal, meaning an output signal that is re-directed back toward the circuit will follow the same paths as the input signal that created the output signal and be transmitted out the input port. This reciprocal behavior is known in optics as Helmholtz Reciprocity. Reciprocity is a symmetry of a system under the interchange of the source and the observer or, in the case of a circuit with an input and an output port, the interchange of the input port and the output port. The inventors have recognized and appreciated that the reduction of noise in a microwave amplifier for detecting low levels of microwave radiation is limited by the principle of reciprocity since noise coming from the final stages of the circuit may find its way back to the device under study with increased intensity. The problem may be particularly important for measurements done on devices at very low temperatures, as is the case with superconducting qubits, and the final stages of the electronics operate at room temperature, which is how conventional superconducting qubit systems are operated. Consequently, the inventors have recognized and appreciated that placing one or more devices that break the reciprocity of the circuit may be used within the circuit to prevent, by their valve-like properties, noise from the room temperature circuitry reaching the low temperature device. Devices that amplify a signal, and are non-reciprocal are referred to as "directional" amplifiers.

The inventors have further recognized and appreciated that conventional non-reciprocal components in microwave electronics are based on the use of ferrites in high magnetic fields. One example of a ferrite-based non-reciprocal component is a circulator. These components are bulky and may be difficult to incorporate into an integrated circuit. Consequently, it may be difficult to integrate a conventional ferrite-based non-reciprocal component with superconducting qubits on a single chip. Moreover, the magnetic field produced from the ferrites that cause the non-reciprocal behavior may negatively impact the performance of superconducting devices because a material's superconductivity loses many of its useful properties in even a modest magnetic field. Accordingly, the inventors have recognized and appreciated that there is a need for non-reciprocal device where the non-reciprocity is not based on the magnetic field of a ferrite, but instead is created using components that may be formed in an integrated circuit.

Some embodiments are directed to a non-reciprocal microwave circuit component that is based on a principle of "active non-reciprocity," which is a technique for creating non-reciprocal microwave components with one or more devices that are actively controlled with one or more input signals. For example, active non-reciprocity may be based on techniques that are phase sensitive, such as parametric up-conversion and down-conversion, which are sensitive to the phase of the pump signal used. For example, if a signal is first up-converted to a higher frequency and then the resulting signal is down-converted back to the original frequency, the overall process phase shifts the signal by an overall phase that depends on the phase difference between the two pump signals used in the two frequency conversion acts. This overall phase shift depends on the direction of the phase gradient between the two frequency conversion pumps.

Some embodiments combine the aforementioned phase shifting technique with two additional techniques: 1) arranging the up-conversion and down-conversion processes to produce overall gain on the received signal, and 2) configuring beam-splitters (sometimes referred to as couplers) with particular characteristics to create a wave interference that transforms the non-reciprocity in phase into a non-reciprocity in amplitude. The result of such embodiments is that signals going in one direction through the device will be amplified whereas signals traveling in the opposite direction through the device will remain substantially the same. The resulting device is a non-reciprocal amplifier referred to as a "directional amplifier." In some embodiments, because of the feedback loop created by the arrangement of components, one or more losses are introduced via, e.g., a coupler or a lossy channel, to ensure that the feedback is stable. For example, the reflection-gain amplitude, r, of the up-conversion and down-conversion processes may be less than the reciprocal of the transmission coefficient, $\alpha$, of a back coupler. Accordingly, the reverse gain amplitude may be increased as the amount of loss introduced between the up-conversion and down-conversion process is increased. However, despite the introduction of losses, embodiments have the capability to perform at or near the quantum limit, meaning the amount of noise added to the signal during the amplification process is at or near the minimum amount of noise that is required to be added by the principle of quantum mechanics. As used throughout the present application, "low-noise" refers to devices that operate at or near the quantum noise limit.

In some embodiments two Josephson Parametric Converters (JPCs) are wired together to provide a low-noise directional amplifier. By the principles of quantum mechanics, any amplification must introduce at least a minimum amount of noise. In some embodiments, the low-noise directional amplifier may introduce noise that is at or near the minimal noise required by quantum mechanics. This minimal noise is the noise equivalent to a half photon. Embodiments may be used to read out one or more superconducting qubits, where embodiments have been experimentally used to improve the signal-to-noise ratio in the qubit measurements while not degrading the performance of the qubit significantly by its back-action noise. In particular, the inventors have used at least one embodiment to observe quantum jumps of the superconducting qubit, which are the hallmarks of efficient, low-noise readout and amplification circuitry. Conventionally, observation of quantum jumps in a superconducting qubit has been done by employing ferrite-based circulators and isolators. At least one embodiment of the present application allows quantum jumps to be observed without such non-reciprocal elements in their pre-amp stages.

FIG. 1 shows a schematic of an integrated circuit (chip 100) according to some embodiments. The chip comprises at least one superconducting qubit 101 and at least one low-noise directional amplifier 103. A single chip 100 may include a plurality of superconducting qubits 101 and a plurality of directional amplifiers 103. Each directional amplifier of the plurality of directional amplifiers is connected to at least one superconducting qubit 101. The chip 100 may include microwave circuitry that connects the plurality of superconducting qubits together such that two or more superconducting qubits may interact with one another. Interactions between superconducting qubits may be used, for example, to implement quantum gates and/or entangle two or more superconducting qubits 101.

The chip 100 may receive input microwave signals from at least one control circuit. The at least one control circuit may provide microwave signals to control the qubit 101 and/or the low-noise directional amplifier 103. For example, the control circuit may send microwave signals to the qubit 101 that implement one or more quantum control gates. The control circuit may also transmit the pump microwaves for use in driving one or more parametric amplifiers in the low-noise directional amplifier 103. In some embodiments, the at least one control circuit may include one or more additional low-noise directional amplifiers. However, any suitable control electronics may be used.

In some embodiments, the chip 100 has at least one output port for outputting amplified microwave signals from the directional amplifier 103. The output signals may be directed to additional amplifiers and/or detection electronics used to record the measured values of the state of the superconducting qubit 101. Any suitable detection electronics may be used.

The superconducting qubit 101 may be any suitable device comprising at least one Josephson Junction. For example, the superconducting qubit 101 may be a charge qubit, a flux qubit, a phase qubit, or a transmon qubit. In some embodiments, the superconducting qubit 101 may include at least one Josephson Junction inside a microwave resonator. The resonator may be, for example, a strip line resonator or a three-dimensional cavity.

The low-noise directional amplifier 103 may be any suitable directional amplifier that is cable of being integrated into chip 100 and is non-reciprocal so as to reduce noise feedback reaching the superconducting qubit 101. Embodiments of low-noise directional amplifiers are discussed in more detail below.

In some embodiments, the entire chip 100 is held at low temperature to reduce noise and to maintain the superconductor below its critical temperature. For example, the chip 100 may be held in a dilution refrigerator at temperatures on the order of tens to hundreds of millikelvin. In some embodiments, the temperature of the chip 100 may be maintained at approximately 10 millikelvin (10 milli-degrees above absolute zero) such that thermal noise is reduced and is not capable of destroying the quantum information stored in the qubit 101 and amplified by the directional amplifier 103. The temperature of the chip 100 may be held at these low temperatures using cryogenic techniques known in the art. For example, a dilution refrigerator using liquid Helium may be used to cool the chip 100 to the selected temperature.

Figure 2:
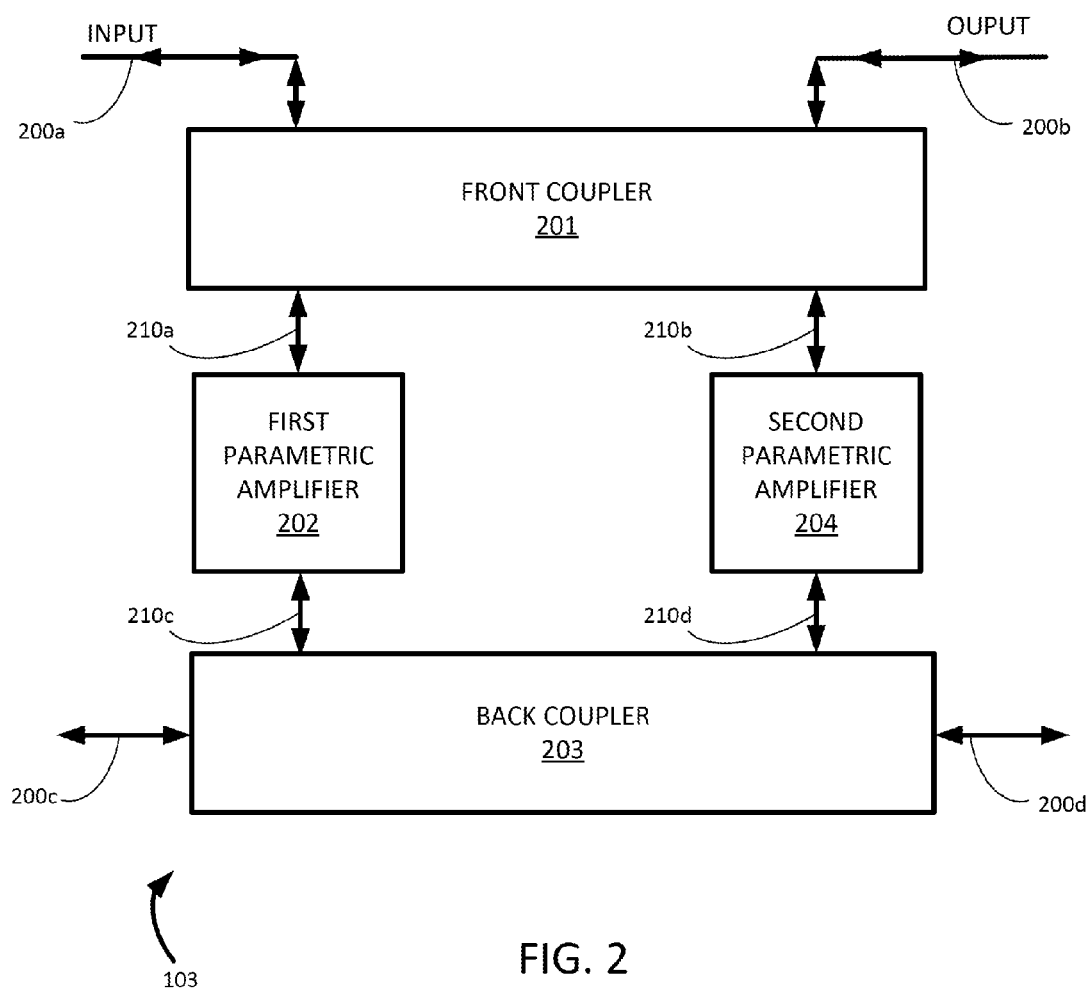
FIG. 2 illustrates a schematic of a low-noise directional amplifier according to some embodiments.

FIG. 2 illustrates a low-noise directional amplifier 103 according to some embodiments. The directional amplifier 103 has at least two external ports that may be used to connect to external devices, such as qubit 101—a first port 200a acting as an input port, and a second port 200b acting as an output port. Additional external ports may also be used. For example, in the embodiment shown in FIG. 2, two additional "cold load" ports, port 200c and port 200d are part of the device. However, ports 200c and 2004 are not used to send or receive signals—they are connected to "cold loads" in that the loads connected to those ports are kept at millikelvin temperatures. The directional amplifier 103 may also include internal ports for connecting a first component of the directional amplifier 103 to a second component of the directional amplifier. For example, port 210a connects a front coupler 201 to a first parametric amplifier 202, port 210b connects the front coupler 201 to a second parametric amplifier 204, port 210c connects the first parametric amplifier 202 to a back coupler 203, and port 210d connects the second parametric amplifier to the back coupler 203. The adjective "front" refers to the fact that the front coupler 201 provides the two external ports (an input port 200a and an output port 200b) that connect the directional amplifier 103 to external components. The adjective "back" refers to the fact that the back coupler 203 does not connect to any external components that send a signal to or receive a signal from the directional amplifier 103.

The embodiment of directional amplifier 103 shown in FIG. 2 comprises four main components: a first coupler 201 (referred to as a front coupler), a second coupler 203 (referred to as a back coupler), a parametric amplifier 202 and a second parametric amplifier 204. In some embodiments, the front coupler 201 is a symmetric coupler that acts like a beamsplitter for microwave input signals. For example, front coupler 201 includes the input port 200a that is configured to receive the signal to be amplified, and may transmit or reflect an input signal to the ports 210a and 210b, respectively. Similarly, while output port 200b is configured to output the amplified signal, a signal representing noise and/or reflections from external components subsequent to the directional amplifier 103 may be received by the directional amplifier 103 via output port 200b and may be transmitted or reflected to ports 210b and 210a, respectively. Based on reciprocity, it is also possible that any signal received by ports 210a and 210b from other portions of the directional amplifier 103 can transmit or reflect the signal out either input port 200a or output port 200b. Some embodiments are configured such that, for the entire system of the directional amplifier 103 receiving a signal via input port 200a, the probability amplitude of a signal being output via input port 200a is substantially equal to zero. This reduction of the probability amplitude reduces feedback to the system being measured/amplified by the directional amplifier 103 (e.g., qubit 101).

The couplers 201 and 203 may have any suitable transmission and reflection amplitudes. For example, for a signal incoming to port 200a of the front coupler 201, the "transmission amplitude" of the front coupler 201 represents the probability amplitude that the signal will leave via internal port 210a, and the "reflection amplitude" of the front coupler 201 represents the probability amplitude that the signal will leave via internal port 210b. In some embodiments, the front coupler 201 and the back coupler 203 may be symmetric couplers, meaning the amplitude of the transmission and reflection amplitudes are equal. For example, the transmission amplitude for a signal incoming to input port 1 of the front coupler 201 may be 1/sqrt(2) and the reflection amplitude for a signal incoming to input port 1 of the front coupler 201 may be i/sqrt(2), where i=sqrt(−1). The back coupler 203 is may have arbitrary transmission amplitude α and arbitrary reflection amplitude iβ, where α and β are both real numbers. In some embodiments, the back coupler may also be a symmetric coupler such that α=β=1/sqrt(2). Symmetric couplers are sometimes referred to as 3 dB couplers. However, embodiments are not limited to any particular transmission or reflection amplitudes for the front coupler 201 and the back coupler 203. The back coupler 203 may be implements in any suitable way. For example, the back coupler may be used to introduce a lossy channel between the first parametric amplifier 202 and the second parametric amplifier 204, in which case a lossy microwave transmission connection may be used instead of a hybrid coupler.

The parametric amplifiers 202 and 204 may be any suitable phase-preserving amplifier. For example, in some embodiments, a Josephson Parametric Converter (JPC) may be used. The JPC is a non-degenerate phase-preserving amplifier based on a ring of Josephson junctions, and is discussed in more detail in connection with FIG. 3 and FIG. 4A-4B below. The two parametric amplifiers 202 and 204 utilize a coherent pump signal to perform the amplification via three-wave mixing. In some embodiments, the phase of the pump for each amplifier may be unequal, but held at a constant relationship with each other. For example, the difference between the two pump phases may be held constant, represented by the formula: $\Delta\varphi = \varphi_1 - \varphi_2 = C$, where $\Delta\varphi$ is the difference between the pump phase $\varphi_1$ of the first amplifier 202 and the pump phase of the second amplifier $\varphi_2$ of the second amplifier 204. In some embodiments, $\Delta\varphi = \pi/2$, which increases the forward gain of the amplifier 103. In some embodiments, the reflection coefficient for the overall device may be tuned to be substantially zero so that components, such as qubit 101, are not disturbed by reflections from directional amplifier 103. In other embodiments, the phase may be tuned such that a reverse gain through the directional amplifier 103 is negligible at the expense of having a non-zero reflection coefficient. Such an embodiment may be useful in application where reducing the reverse gain is important and where the corresponding non-zero reflection coefficient will not create problems for other components of the system.

Figure 3:
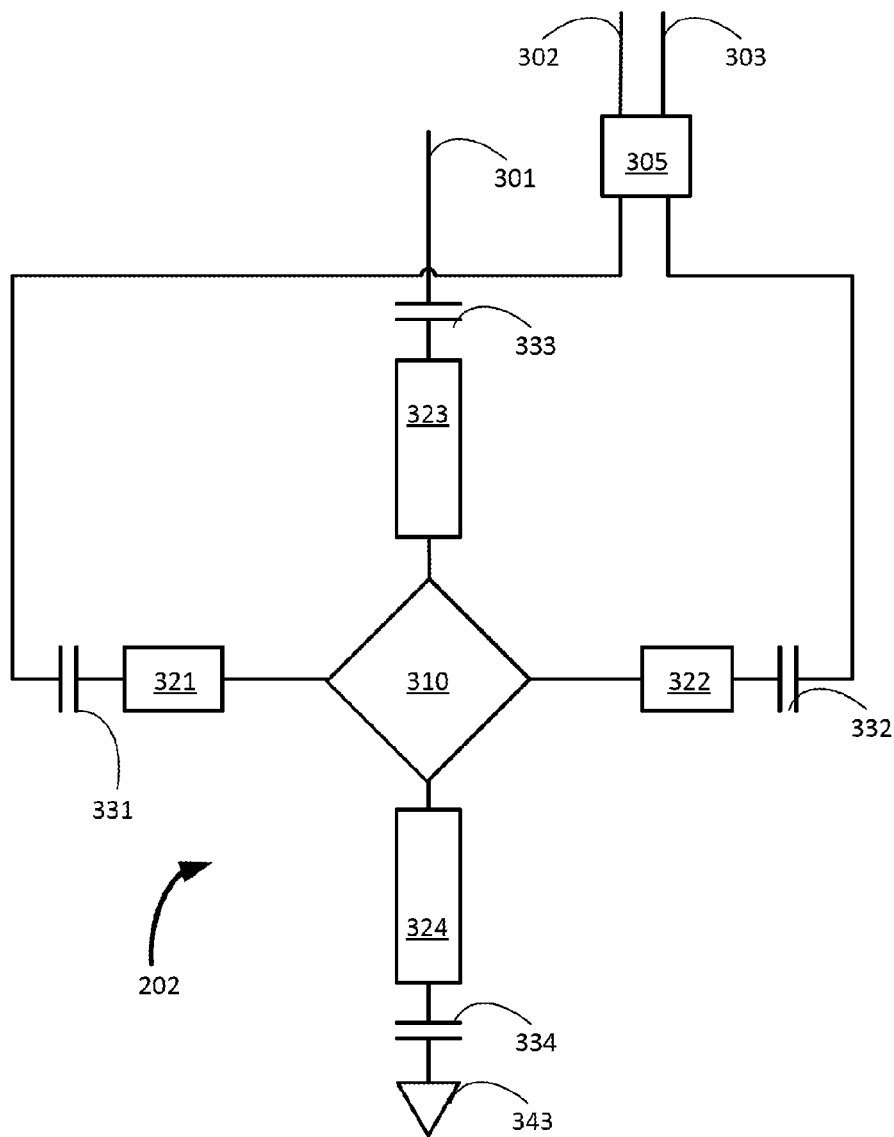
FIG. 3 illustrates a Josephson Parametric Converter according to some embodiments.

FIG. 3 illustrates an example JPC 202 according to some embodiments. The central element of JPC 202 is a Josephson ring modulator 402, which is discussed in more detail in connection with FIG. 4A-4B. Signals are input and output from the JPC 202 via ports 301-303. Because JPC 202 is a parametric amplifier for microwave frequencies, the nomenclature of optical parametric amplifiers that implement three-wave mixing is adopted. Accordingly, port 301 corresponds to the "signal mode," which may include, for example, microwave radiation with a small intensity, which will be amplified by the JPC 202; port 302 corresponds to the "idler mode," which may be an empty mode with no microwave radiation present (i.e., a vacuum state); and port 303 corresponds to the "pump mode," which may include, for example, microwave radiation with a much larger intensity than the intensity of the microwave radiation in the signal mode. The microwave radiation in the pump mode is what provides the energy to amplify the radiation in the signal mode. In some embodiments, port 301 of FIG. 3 corresponds to port 200a of FIG. 2 and port 302 of FIG. 3 corresponds to port 200b of FIG. 2. In this way, the idler modes of the two JPCs 202 and 204 are connected via the back coupler 203.

The JPC 202 includes two transmission line resonators that support one-half wave at the operational frequency, e.g., the length of the resonator is substantially equal to the length of one-half of the operational wavelength. Any suitable transmission line resonator may be used, such as, for example, stripline resonators. In some embodiments, JPC 202 performs non-degenerate amplification, which means the wavelength of the idler mode is different from the wavelength of the signal mode. In non-degenerate embodiments, the JPC 202 supports two fundamental modes of different frequency—a first frequency $\omega_s$ associated with a signal and a second frequency $\omega_i$ associated with an idler. The modes may be determined by the length of two half-wave microstrip resonators of the JPC. To apply gain, the ring is pumped with a coherent non-resonant pump P at the sum frequency $\omega_p = \omega_s + \omega_i$. In non-degenerate embodiments, the first transmission line resonator comprises portion 321 and portion 322 and supports the shorter wavelength idler mode than the second transmission line resonator, which comprises portion 323 and portion 324 and supports the longer wavelength signal mode. The two transmission line resonators cross each other at a voltage node, where the Josephson Ring Modulator (JRM) is disposed.

Each portion of the transmission line resonators is associated with a respective coupling capacitor: portion 321 of the first transmission line resonator is associated with coupling capacitor 331, portion 322 of the first transmission line resonator is associated with coupling capacitor 332, portion 323 of the second transmission line resonator is associated with coupling capacitor 333, and portion 324 of the first transmission line resonator is associated with coupling capacitor 334. Coupling capacitors 331 and 332, associated with the idler mode, are coupled to the port 302 associated with the idler mode and coupling capacitor 333 is coupled to the port 301 associated with the signal mode. Coupling capacitor 334 is shorted to ground 343 or a 50Ω cold load.

In some embodiments, the idler mode and the pump mode are mixed at a 180 degree hybrid coupler 305. The frequency of the pump radiation, which is equal to the sum of the frequency of the signal radiation and the frequency of the idler radiation, is not resonant with the JPC 202. While not illustrated in FIG. 3, in some embodiments, instead of connecting coupling capacitor 334 to ground, the port 301 associated with the signal mode may be input into a hybrid coupler along with a 50Ω cold load, the two outputs of the hybrid coupler being connected to coupling capacitor 333 and coupling capacitor 334.

The JPC 202 is based on a Josephson ring modulator 310 (JRM), which provides the nonlinearity that results in the three-wave mixing process that amplifies the radiation in the signal mode. The JRM 310 including at least four superconducting tunnel junctions (Josephson junctions), which is flux biased with a flux of $\Phi_0/2$, where $\Phi_0 = h/2e$ is the quantum flux The Josephson ring modulator 310 acts as a nonlinear medium and mixes the frequencies by converting pump photons into signal and idler photons. In particular, amplification of the signal is achieved via down-conversion of the pump P into microwave photons at the signal frequency $\omega_s$. The signal mode is well isolated from the pump and idler modes, keeping the signal free from noise from the pump and idler photons. The phase acquired during the transmission gain process of the JPC is non-reciprocal and depends on the phase of the pump P.

Figure 4:
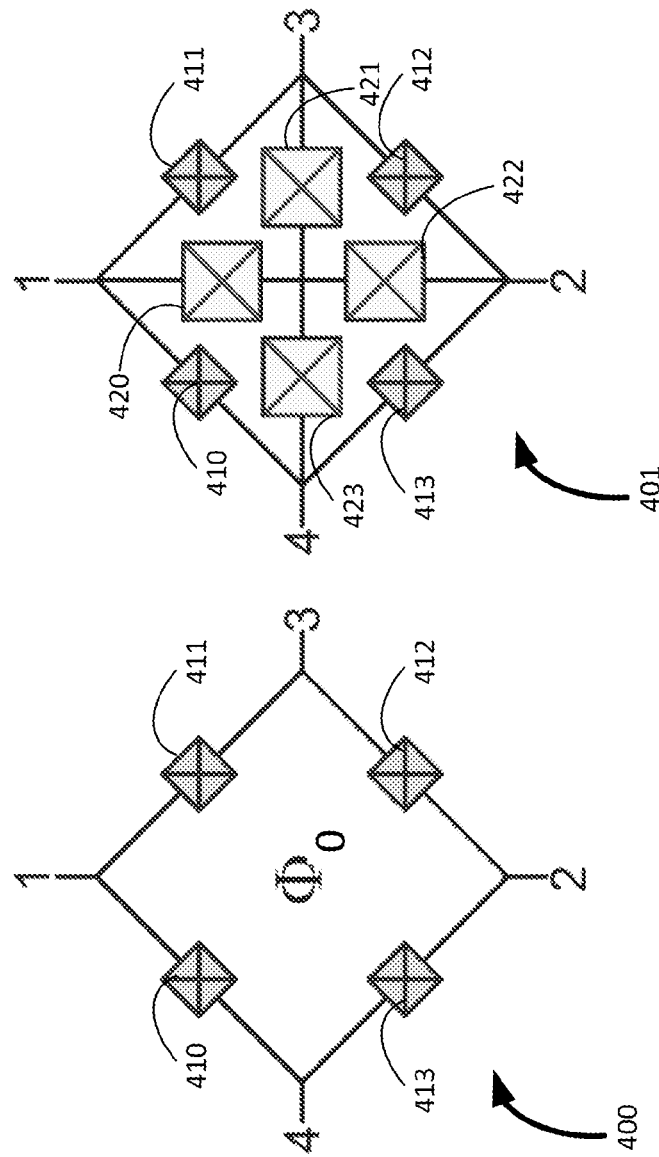
FIG. 4A illustrates a schematic of an unshunted Josephson Ring Modulator according to some embodiments.
FIG. 4B illustrates a schematic of a shunted Josephson Ring Modulator according to some embodiments.

FIG. 4A illustrates a schematic of a first JRM 400 according to some embodiments. The JRM 400 includes for input/output ports (1-4) and four Josephson junctions 410-413 in a Wheatstone bridge-like configuration. In some embodiments, the four Josephson junctions 410-413 have substantially the same properties. FIG. 4B illustrates a schematic of a second JRM 401 according to some embodiments. The JRM 401 includes for input/output ports (1-4), four Josephson junctions 410-413 in a Wheatstone bridge-like configuration, and four shunting Josephson junctions 420-423. The shunting Josephson junctions 420-423 may be larger than the four Josephson junctions 410-413. Including the shunting Josephson junctions 410-413 may increase the tenability of the JRM 401 relative to the unshunted JRM 400. In bother JRM 400 and JRM 401, the Josephson junctions 410-413 are what introduce the nonlinearity into the JPC 202.

Though a particular type of JPC based on microstrip resonators is illustrated above, some embodiments may use other types of JPCs. For example, compact resonator JPCs, based on resonators created from capacitors and resonators rather than a microstrip of a particular length, and capacitively and inductively shunted JPCs, where the capacitive elements of the JPC are parallel plate capacitors and the inductance is governed primarily by the inductance of the Josephson junctions. Moreover, the parametric amplifiers 202 and 204 are not limited to JPCs at all. Any suitable phase-preserving amplifier may be used.

Figure 5:
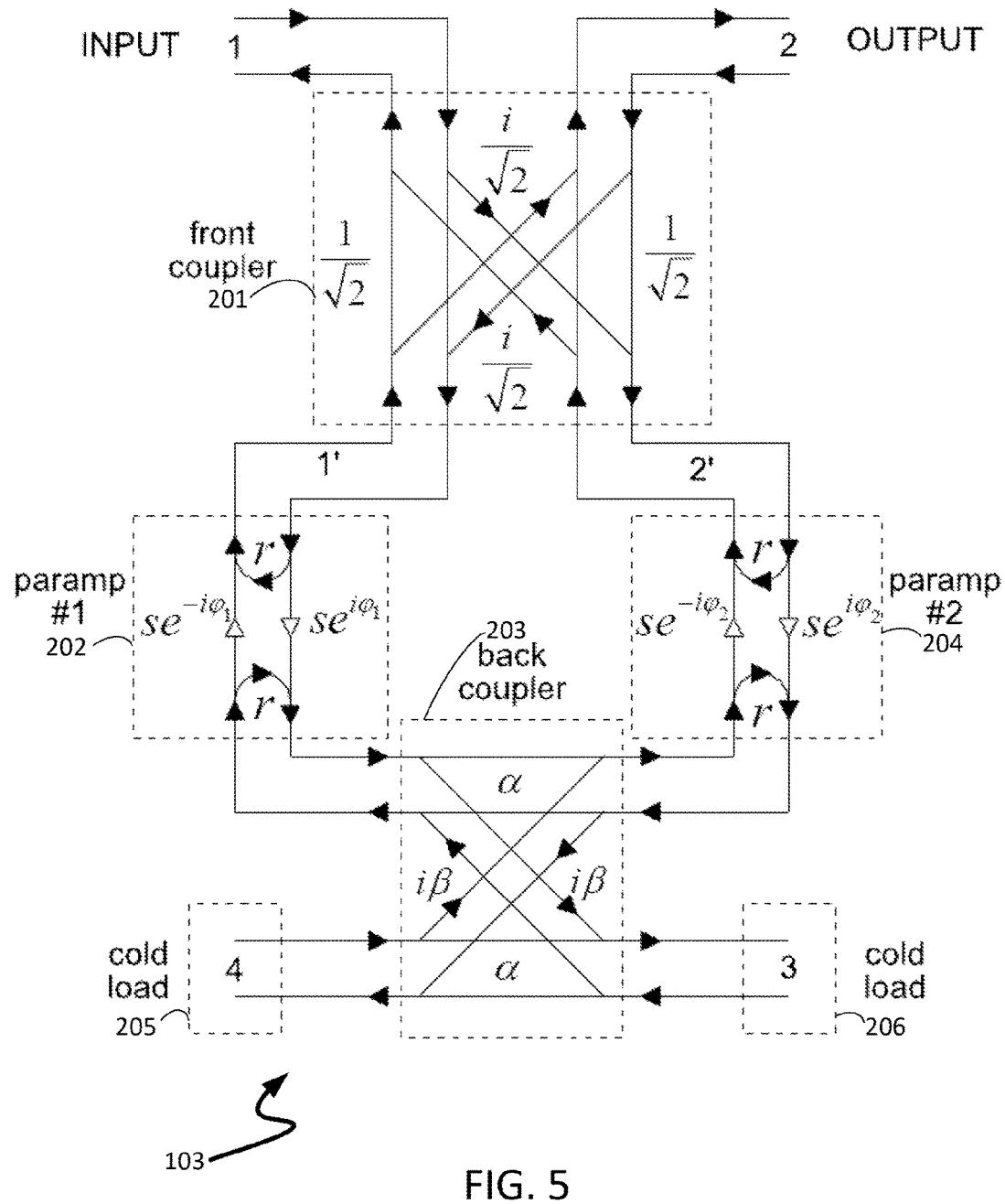
FIG. 5 illustrates the paths waves may take through a directional amplifier according to some embodiments.

Whereas FIG. 2 is a schematic illustrating the physical ports and connections of directional amplifier 103, FIG. 5 is a schematic representation of directional amplifier 103 where each line represents a path that a wave may take through the system. For example, the input port 1 is associated with two lines: a first line representing a wave flowing into the directional amplifier 103 and a second line representing a wave flowing back out from the directional amplifier 103. The lines in FIG. 5 are marked with an arrows representing the direction of the wave flow associated with each line.

FIG. 5 illustrates the same main components of the directional amplifier 103 as well as the relevant variables associated with each component's effects on waves that enter the directional amplifier 103. For example, the front coupler 201 is labeled with the reflection amplitudes and transmission amplitudes associated with each line. Because front coupler 201 is a symmetric (3 dB) coupler, the transmission amplitude for microwaves entering port 1 and exiting port 1' and the transmission amplitude for microwaves entering port 1' and exiting port 1 and the transmission amplitude for microwaves entering port 2 and exiting port 2' and the transmission amplitudes for microwaves entering port 2' and exiting port 2 are all equal to 1/sqrt(2). Whereas the reflection amplitude for microwaves entering port 1 and exiting port 2', the reflection amplitude for microwaves entering port 2' and exiting port 1, the reflection amplitude for microwaves entering port 2 and exiting port 1', and the reflection amplitude for microwaves entering port 1' and exiting port 2 are all equal to i/sqrt(2), where i=sqrt(−1).

Similarly, the back coupler 203 is associated with its own set of transmission amplitudes, $\alpha$, and reflection amplitudes, $i\beta$, where $\alpha$ and $\beta$ are both real numbers. The transmission and reflection amplitudes of the back coupler 203 may be tuned to desired values as illustrated below.

The first parametric amplifier 202 and the second parametric amplifier 204 are each associated with a reflection gain amplitude and a transmission gain amplitude at the resonant frequency, which are is denoted as r and s, respectively. The reflection and transmission gain amplitudes satisfy the relation $r^2 - s^2 = 1$. The gain amplitudes are complex numbers, the absolute value squared of the gain amplitudes representing the actual gain a signal will experience when reflected by or transmitted through the parametric amplifiers. Some embodiments, such as the one shown in FIG. 5, use the same r and s for both the first parametric amplifier 202 and the second parametric amplifier 204, however, embodiments are not limited to having the same gain amplitudes. Other embodiments may use different gains for the two amplifiers. Any suitable value of r and s may be used. In some embodiments, the reflection gain amplitude r is limited to be within the range $1 \leq r < \alpha^{-1}$. A reflection gain amplitude within this range may result in a more stable feedback loop within the directional amplifier 103.

The first parametric amplifier 202 and the second parametric amplifier 204 are also each associated with a phase that is determined by the phase of the pump used to drive the amplifiers. The first parametric amplifier 202 has a first phase, $\varphi_1$, and the second parametric amplifier 202 has a first phase, $\varphi_2$. The difference between the first phase the second phase may be set to any value. For example, in some embodiments, the difference between the first phase the second phase is equal to pi/2 radians (or 90 degrees), i.e., $\varphi_1 - \varphi_2 = \pi/2$.

There are four paths through the directional amplifier 103 illustrated in FIG. 5 that ultimately lead from input port 1 to output port 2, that will be illustrated in connection with FIG. 6A-6D. Each figure shows the same directional amplifier 103 as illustrated in FIG. 5, but with arrows highlighting a particular path through the amplifier 103.

Figure 6A:
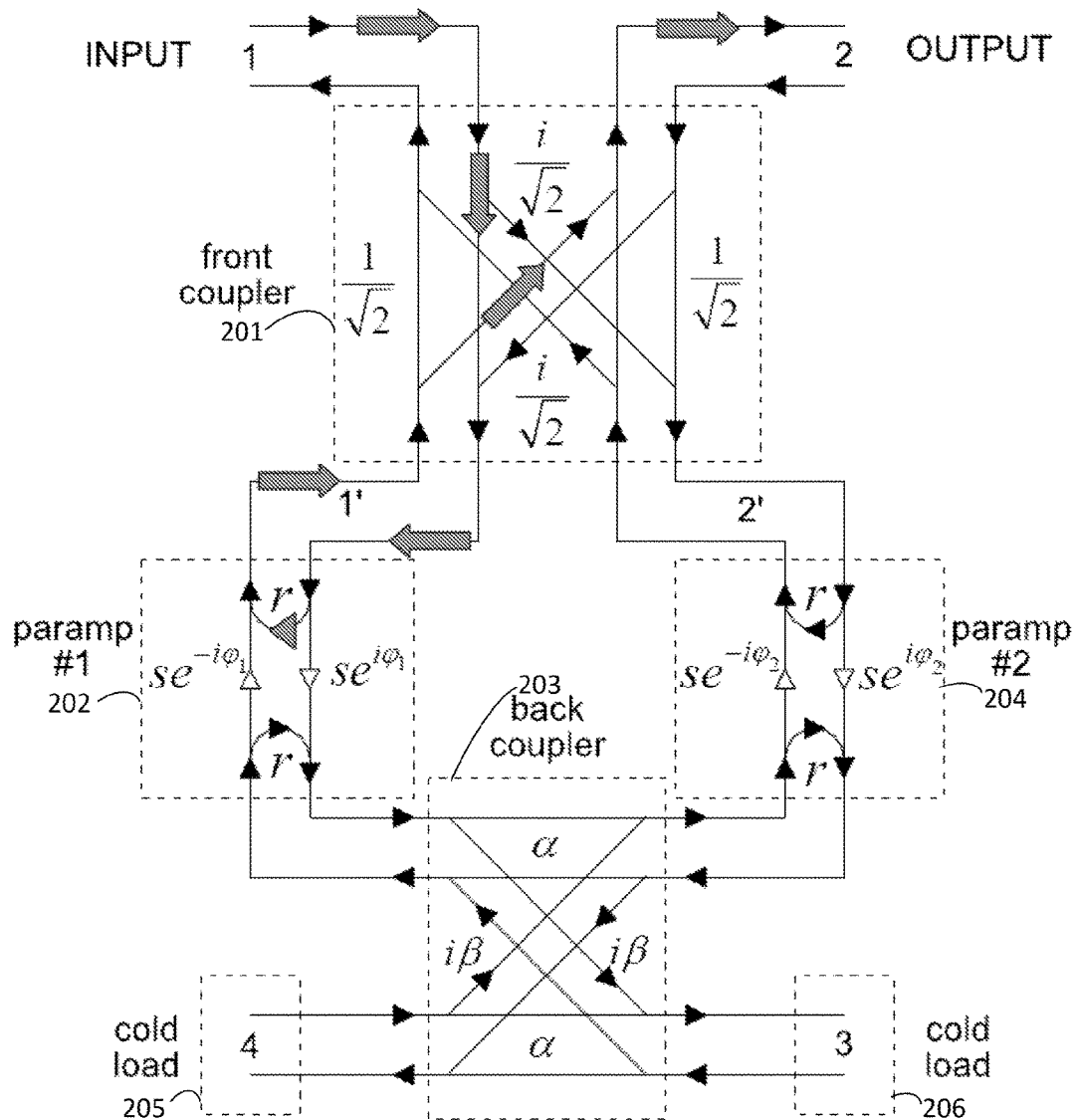
FIG. 6A illustrates a first path of a wave through a directional amplifier according to some embodiments.

In the first path, illustrated in FIG. 6A, a signal incoming to port 1 is transmitted with transmission amplitude 1/sqrt(2) through the front coupler 201 to port 1'. Upon reaching the first parametric amplifier 202, the signal is reflected, with a gain amplitude r, back to the front coupler 201. At the front coupler 201, the signal is reflected with reflection amplitude i/sqrt(2) to the output port 2, where the signal exits the device 103.

Figure 6B:
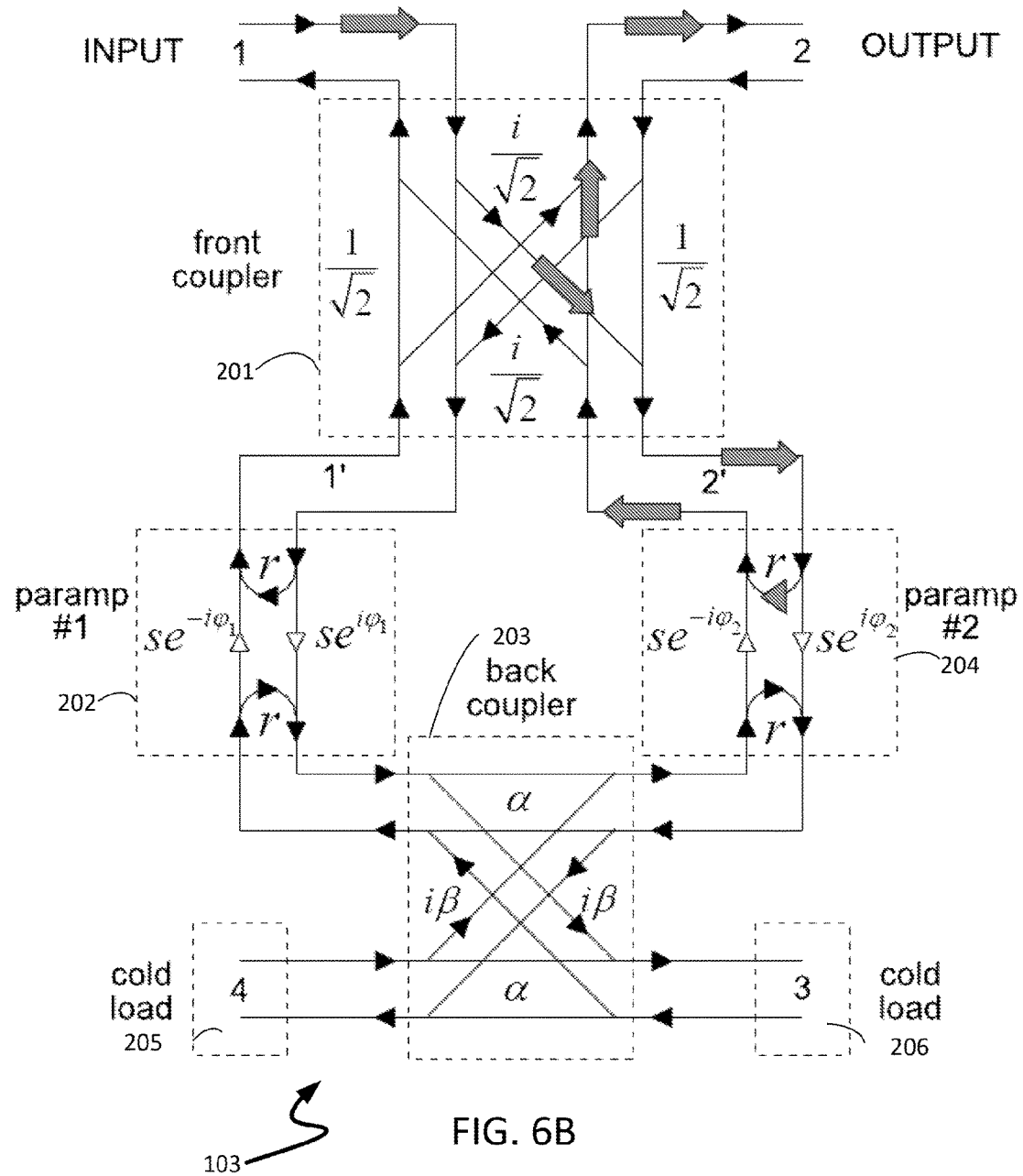
FIG. 6B illustrates a second path of a wave through a directional amplifier according to some embodiments.

In the second path, illustrated in FIG. 6B, a signal incoming to port 1 is reflected with reflection amplitude i/sqrt(2) in the front coupler 201 to port 2'. Upon reaching the second parametric amplifier 204, the signal is reflected with a gain amplitude r back to the front coupler 201. At the front coupler 201, the signal is transmitted with transmission amplitude 1/sqrt(2) to the output port 2, where the signal exits the device 103.

Figure 6C:
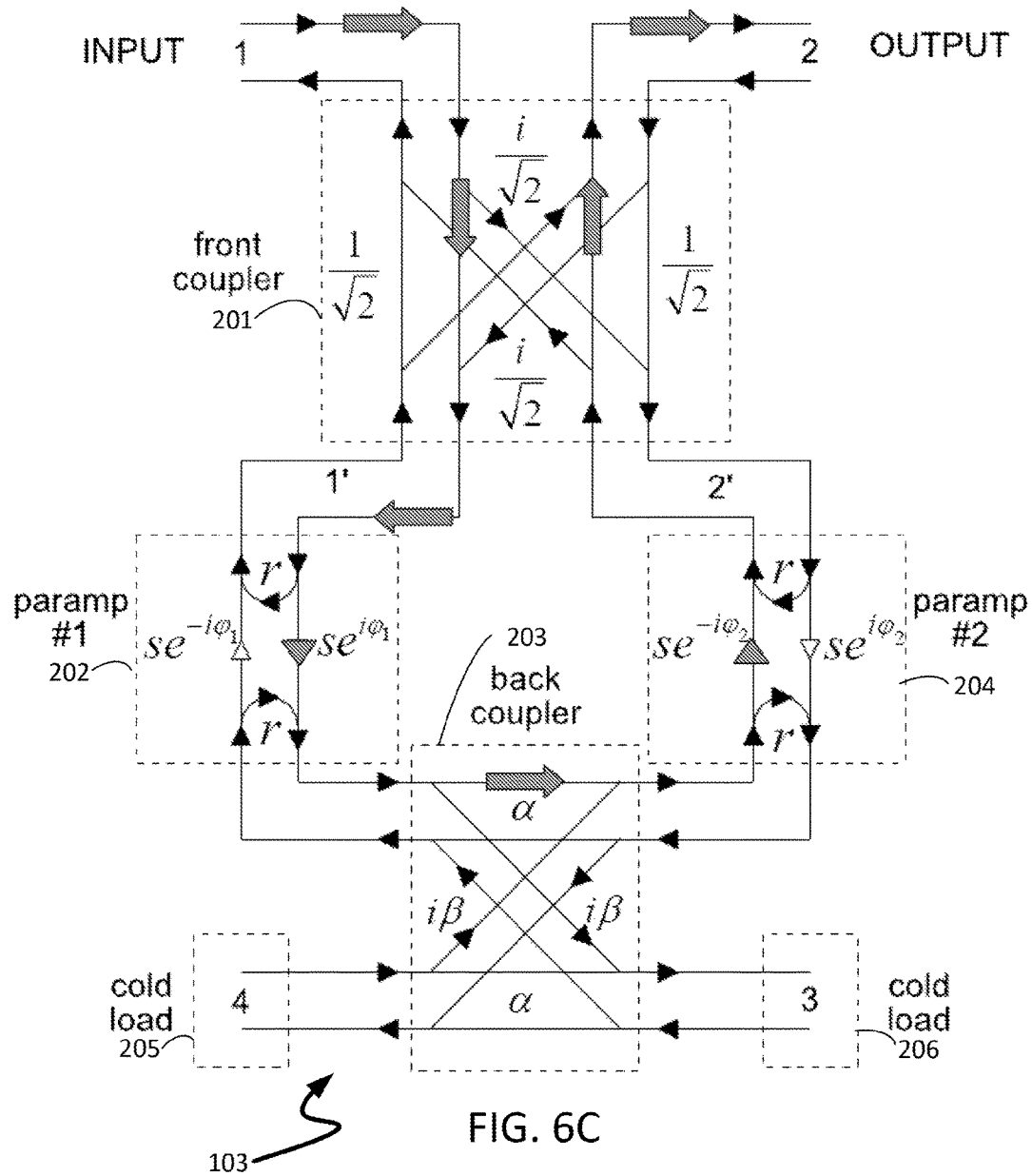
FIG. 6C illustrates a third path of a wave through a directional amplifier according to some embodiments.

In the third path, illustrated in FIG. 6C, a signal incoming to port 1 is transmitted with transmission amplitude 1/sqrt(2) through the front coupler 201 to port 1'. Upon reaching the first parametric amplifier 202, the signal is transmitted with a gain amplitude s and a phase $\varphi_1$ to the second parametric amplifier 204. At the second parametric amplifier 204, the signal is transmitted with a gain amplitude of s and a phase of $\varphi_2$ to the front coupler. At the front coupler 201, the signal is transmitted with transmission amplitude 1/sqrt(2) to the output port 2, where the signal exits the device 103.

Figure 6D:
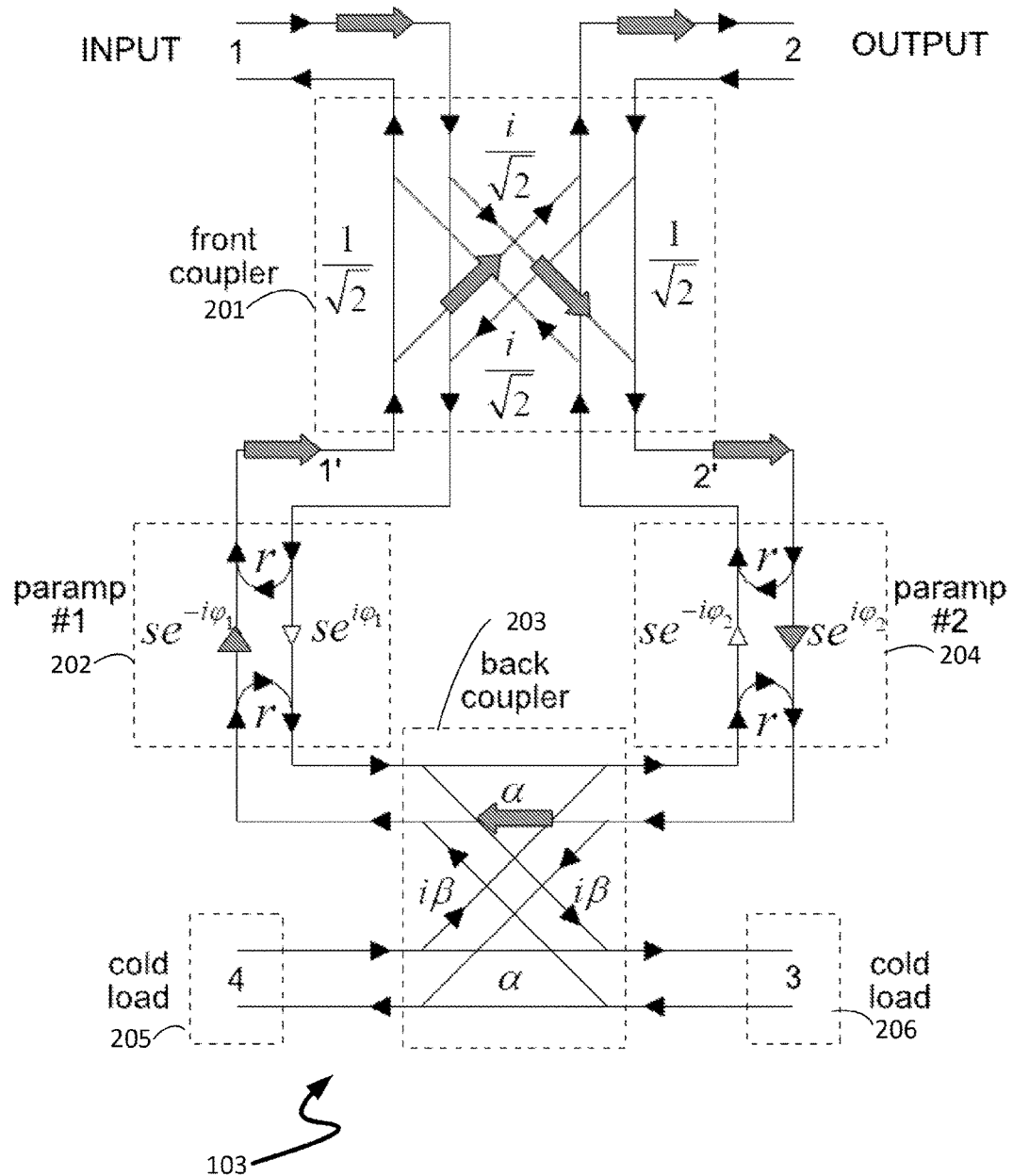
FIG. 6D illustrates a fourth path of a wave through a directional amplifier according to some embodiments.

In the fourth path, illustrated in FIG. 6D, a signal incoming to port 1 is reflected with reflection amplitude i/sqrt(2) in the front coupler 201 to port 2'. Upon reaching the second parametric amplifier 204, the signal is transmitted with a gain amplitude s and a phase $\varphi_2$ to the first parametric amplifier 202. At the first parametric amplifier 202, the signal is transmitted with a gain amplitude of s and a phase of $\varphi_1$ to the front coupler. At the front coupler 201, the signal is reflected with reflection amplitude 1/sqrt(2) to the output port 2, where the signal exits the device 103.

These four paths add coherently such that the paths interfere with one another, resulting in the desired amplification of the received microwave signal. It is possible to express the effect of the directional amplifier 103 in terms of the various parameters of the components of the directional amplifier 103 using a "scattering matrix," which maps how signal input into any of the four ports of the device is transformed by the directional amplifier 103 into an output signal that is output from the four ports. Thus, a scattering matrix S is defined as:

$$[S] = \begin{pmatrix} S_{11} & S_{12} & S_{13} & S_{14} \\ S_{21} & S_{22} & S_{23} & S_{24} \\ S_{31} & S_{32} & S_{33} & S_{34} \\ S_{41} & S_{42} & S_{43} & S_{44} \end{pmatrix} \quad \text{(Equation 1)}$$

where $S_{ij}$ represents the scattering amplitude for a signal input into port j and output from port i. In some embodiments, when all the components of the directional amplifier 103 are taken into account, the scattering matrix simplifies into the form illustrated below. In said embodiments, the back coupler's transmission and reflection amplitudes are set such that $\alpha = \beta = 1/\sqrt{2}$ and the phase difference between the two parametric amplifiers is set such that $\Delta\varphi = \pi/2$. In this case, the scattering matrix of the directional amplifier 103 simplifies to $$[S] = \begin{pmatrix} 0 & i\sqrt{H} & \sqrt{\frac{H-1}{2}} & -\sqrt{\frac{H-1}{2}} \\ i\sqrt{G} & 0 & i\sqrt{\frac{G-1}{2}} & i\sqrt{\frac{G-1}{2}} \\ -\sqrt{\frac{G-1}{2}} & -i\sqrt{\frac{H-1}{2}} & -\frac{\sqrt{G}+\sqrt{H}}{2} & \frac{\sqrt{G}-\sqrt{H}}{2} \\ -\sqrt{\frac{G-1}{2}} & i\sqrt{\frac{H-1}{2}} & \frac{\sqrt{G}-\sqrt{H}}{2} & -\frac{\sqrt{G}+\sqrt{H}}{2} \end{pmatrix} \quad \text{[Equation 2]}$$

where the following parameter definitions are used:

$$g + h = \sqrt{G}, \quad \text{(Equation 3)}$$

$$g - h = \sqrt{H}, \quad \text{(Equation 4)}$$

$$g = \frac{\sqrt{1+s^2}}{1-s^2}, \text{ and} \quad \text{(Equation 5)}$$

$$h = \frac{\sqrt{2}\,s^2}{1-s^2}. \quad \text{(Equation 6)}$$

The above Equations 2-6 illustrate that, when the front coupler and back coupler amplitudes are fixed and the phase difference is fixed, the entire scattering matrix of the directional amplifier 103 may be written such that the only parameter is the transmission gain amplitude s of the two parametric amplifiers. Thus, it is possible to determine how the directional amplifier 103 behaves when the device is "off" by setting s=0. This may be done by turning off the pump signal or otherwise preventing the pump signal from entering the parametric amplifiers 202 and 204. When the directional amplifier 103 is off, the scattering matrix reduces to:

$$[S] = \begin{pmatrix} 0 & i & 0 & 0 \\ i & 0 & 0 & 0 \\ 0 & 0 & -1 & 0 \\ 0 & 0 & 0 & -1 \end{pmatrix}. \quad \text{(Equation 7)}$$

The scattering matrix of Equation 7 indicates that when the directional amplifier 103 is turned off, the transmission amplitude from the input port 1 to the output port 2 is unity. Accordingly, the device connected to port 1 from which the signal is obtained (e.g., a superconducting qubit 101), may be measured using alternative measurement means without disconnecting the directional amplifier 103 or using a switch to switch between the directional amplifier and the alternative measurement means.

In the "high gain limit," where the parametric amplifiers are pumped with as much gain as physically possible, s=1. Using Equations 5 and 6, the limit from below of the scattering matrix may be calculated to determine how the directional amplifier acts in this high gain limit as s approaches unity. In the high gain limit:

$$\sqrt{G} = \infty \quad \text{(Equation 8)}$$

and $$\sqrt{H} = \frac{3}{2\sqrt{2}}. \quad \text{(Equation 9)}$$

Thus, the scattering matrix for the directional amplifier becomes:

$$[S] = \begin{bmatrix} 0 & i\sqrt{\frac{9}{8}} & \frac{i}{4} & -\frac{i}{4} \\ i\sqrt{G} & 0 & -\sqrt{\frac{G-1}{2}} & -\sqrt{\frac{G-1}{2}} \\ -i\sqrt{\frac{G-1}{2}} & \frac{1}{4} & \frac{\sqrt{G}+\sqrt{9/8}}{2} & \frac{\sqrt{G}-\sqrt{9/8}}{2} \\ i\sqrt{\frac{G-1}{2}} & -\frac{1}{4} & \frac{\sqrt{G}-\sqrt{9/8}}{2} & \frac{\sqrt{G}+\sqrt{9/8}}{2} \end{bmatrix} \quad \text{(Equation 7)}$$

Thus, in the high gain limit, the theoretical gain for a signal input via port 1 of directional amplifier 103 is infinite while the reverse gain of the device is limited to $|S_{12}|^2 = 9/8$, which is very near unity. Accordingly, in some embodiments, the directional amplifier 103 has potentially unlimited forward gain while limiting the amount of reverse gain through the device. Also, input port 1 and output port 2 are perfectly matched such that $S_{11} = S_{22} = 0$, indicating that there is no reflection signal even at the high gain limit.

The above embodiments thus illustrate an embodiment of a non-reciprocal directional amplifier capable of quantum-limited operation with, in principle, no limitation on the forward gain and 9/8 limit on the reverse gain.

In other embodiments, it may be desirable to reduce the reverse gain (e.g., element $S_{21}$ of the scattering matrix) through the directional amplifier 103. Accordingly, the scattering matrix may be tuned such that a reverse gain through the directional amplifier 103 is negligible at the expense of having a non-zero reflection coefficient. Such an embodiment may be useful in application where reducing the reverse gain is important and where the corresponding non-zero reflection coefficient will not create problems for other components of the system.

Figure 7:
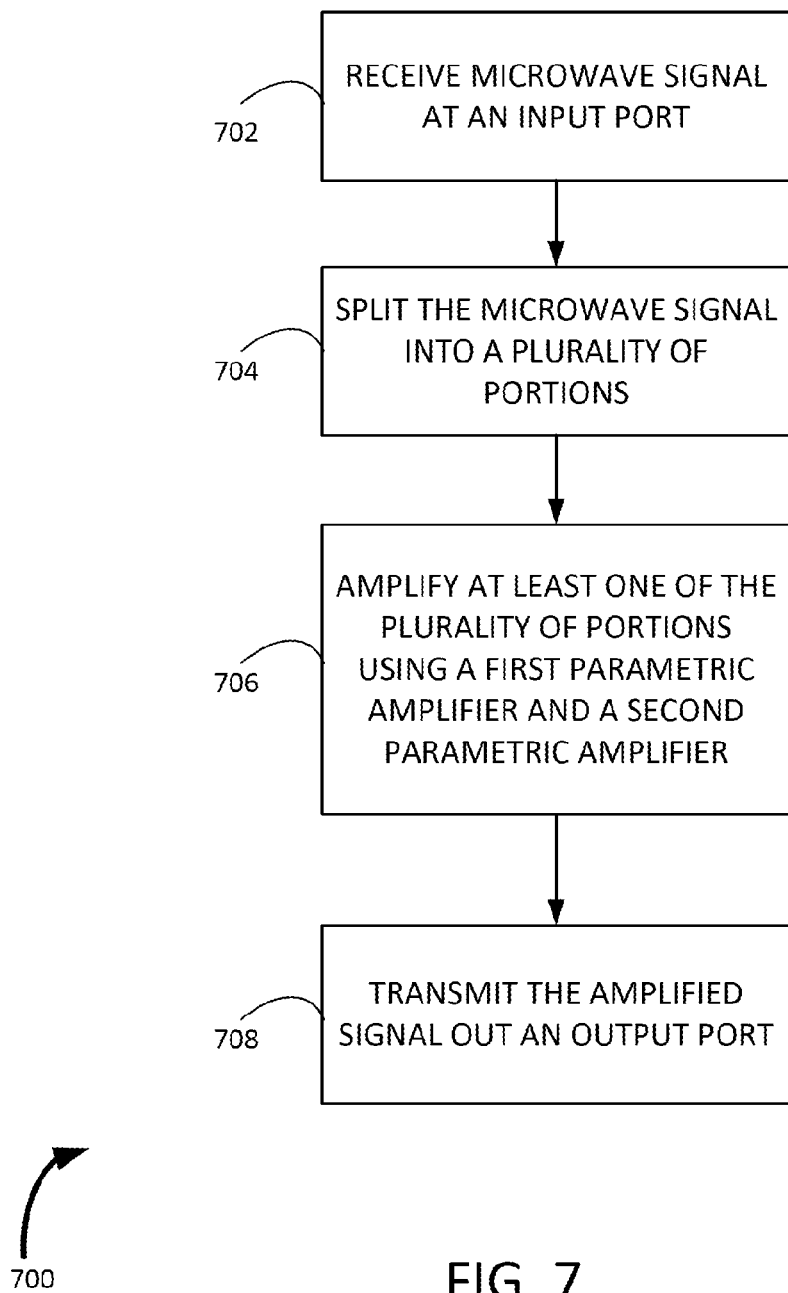
FIG. 7 illustrates a method of amplifying a signal according to some embodiments.

FIG. 7 illustrates a method 700 of amplifying a signal according to some embodiments. At act 702, a microwave signal is received at an input port of a directional amplifier such as the directional amplifier according to some of the embodiments illustrated above. At act 704, the received microwave signal is split at a hybrid coupler into two portions. The signal may further be split into additional portions at a first parametric amplifier and/or a second parametric amplifier based on whether the respective amplifier reflects or transmits the received signal.

At act 706, at least a portion of the signal is amplified by both the first parametric amplifier and the second parametric amplifier. In some embodiments, the first parametric amplifier is pumped using a first microwave pump with a first phase and the second parametric amplifier is pumped using a second microwave pump with a second phase. In some embodiments, the difference between the first phase and the second phase is pi/2 radians.

While embodiments of the low-noise directional amplifier are illustrated above as being used to measure a superconducting qubit, embodiments may be used in a variety of applications. For example, embodiments may be used to initialize and/or perform quantum gate operations on superconducting qubits.

While embodiments of the low-noise directional amplifier may be used to measure the state of a superconducting qubit, embodiments may be used in a variety of applications. For example, embodiments may be used to initialize and/or perform quantum gate operations on superconducting qubits. Embodiments may also have applications outside of quantum information processing. For example, embodiments may be used in any situation where detection of low intensity microwave radiation is being performed, such as microwave telescopes used in astronomy or the detection of radar signals.

Having thus described and illustrated several aspects of at least one embodiment of a low-noise directional amplifier it is to be appreciated that various alterations, modifications, and improvements will readily occur to those skilled in the art. Such alterations, modifications, and improvements are intended to be part of this disclosure, and are intended to be within the spirit and scope of the invention. While the present teachings have been illustrated in conjunction with various embodiments and examples, it is not intended that the present teachings be limited to such embodiments or examples. On the contrary, the present teachings encompass various alternatives, modifications, and equivalents, as will be appreciated by those of skill in the art. Those skilled in the art will readily appreciate that all parameters, dimensions, materials, and configurations described are provided as non-limiting examples and that the actual parameters, dimensions, materials, and/or configurations will depend upon the specific application or applications for which the inventive teachings is/are used. Those skilled in the art will also recognize, or be able to ascertain using no more than routine experimentation, many equivalents to the specific inventive embodiments described. It is, therefore, to be understood that the foregoing embodiments are presented by way of example only and that, within the scope of the invention, inventive embodiments may be practiced otherwise than as specifically described and claimed. Inventive embodiments of the present disclosure may be directed to each individual feature, system, system upgrade, and/or method described. In addition, any combination of two or more such features, systems, and/or methods, if such features, systems, system upgrade, and/or methods are not mutually inconsistent, is included within the inventive scope of the present disclosure.

Further, though some advantages of the described embodiments may be indicated, it should be appreciated that not every embodiment will include every described advantage. Some embodiments may not implement any features described as advantageous. Accordingly, the foregoing description and drawings are by way of example only.

The indefinite articles "a" and "an," as used herein, unless clearly indicated to the contrary, should be understood to mean "at least one."

The phrase "and/or," as used herein, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," will refer to the inclusion of exactly one element of a number or list of elements. In general, the term "or" as used shall only be interpreted as indicating exclusive alternatives (i.e. "one or the other but not both") when preceded by terms of exclusivity, such as "either," "one of," "only one of," or "exactly one of."

As used herein, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

All transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. A low-noise directional amplifier comprising:
    a first port and a second port;
    a first coupler and a second coupler, wherein the first port and the second port are coupled to the first coupler;
    a first phase preserving amplifier connected to the first coupler and the second coupler; and
    a second phase preserving amplifier connected to the first coupler and the second coupler, wherein a phase of a pump signal of the first phase preserving amplifier is different from a phase of a pump signal of the second phase preserving amplifier, and the difference between the phase of the pump signal of the first phase preserving amplifier and the phase of the pump signal of the second phase preserving amplifier determines a non-reciprocity of the low-noise directional amplifier,
    wherein the first port is an input port configured to receive at least one input signal and the second port is an output port configured to output at least one output signal.

2. The low-noise directional amplifier of claim 1, wherein a transmission of a signal from the first port to the second port is substantially 100% when no pump signals are applied to the first phase preserving amplifier and the second phase preserving amplifier.

3. The low-noise directional amplifier of claim 1, further comprising a third port coupled to a first cold load and a fourth port coupled to a second cold load.

4. The low-noise directional amplifier of claim 1, wherein low-noise directional amplifier comprises four or fewer ports, wherein the four or fewer ports include the first port and the second port.

5. The low-noise directional amplifier of claim 1, wherein the first coupler is a 3 dB coupler.

6. The low-noise directional amplifier of claim 1, wherein a reflection gain amplitude of the first phase preserving amplifier is the same as a reflection gain amplitude of the second phase preserving amplifier and a transmission gain amplitude of the first phase preserving amplifier is the same as a transmission gain amplitude of the second phase preserving amplifier.

7. The low-noise directional amplifier of claim 6, wherein the reflection gain amplitude of the first phase preserving amplifier is greater than or equal to unity and less than a reciprocal of a transmission amplitude of the second coupler.

8. The low-noise directional amplifier of claim 1, wherein the first phase preserving amplifier and the second phase preserving amplifier are each a Josephson Parametric Converter (JPC).

9. The low-noise directional amplifier of claim 1, wherein the low-noise directional amplifier is non-reciprocal and does not include a circulator.

10. The low-noise directional amplifier of claim 1, wherein the difference between a phase of the first pump signal and a phase of the second pump signal is $\pi/2$ radians.

11. The low-noise directional amplifier of claim 1, wherein the low-noise directional amplifier is at least part of an integrated circuit.

12. A method of amplifying a microwave signal, the method comprising acts of:
    receiving the signal at an input port of a directional amplifier;
    amplifying at least a portion of the signal using both a first parametric amplifier and a second parametric amplifier to create an amplified signal; and
    transmitting the amplified signal out an output port of the directional amplifier, wherein:
        the first parametric amplifier is pumped using a first microwave pump with a first phase;
        the second parametric amplifier is pumped using a second microwave pump with a second phase, wherein the difference between the first phase and the second phase is pi/2 radians; and
        a transmission of a signal from the input port to the output port is substantially 100% when no pump signals are applied to the first phase preserving amplifier and the second phase preserving amplifier.

13. The method of claim 12, wherein the first parametric amplifier and the second parametric amplifier are each a Josephson Parametric Converter (JPC).

14. The method of claim 12, wherein the input port and output port are each coupled to the first and second parametric amplifier via a 3 dB coupler.

15. The method of claim 12, further comprising an act of:
    splitting the signal into at least two portions prior to the act of amplifying.

16. An integrated circuit comprising:
    a low-noise directional amplifier comprising:
        a first port and a second port;
        a first coupler and a second coupler, wherein the first port and the second port are coupled to the first coupler;

a first phase preserving amplifier connected to the first coupler and the second coupler; and a second phase preserving amplifier connected to the first coupler and the second coupler; and a qubit coupled to the low-noise directional amplifier such that the low-noise directional amplifier is configured to measure a state of the qubit, wherein:

the first port is an input port configured to receive at least one input signal and the second port is an output port configured to output at least one output signal;

a reflection gain amplitude of the first phase preserving amplifier is the same as a reflection gain amplitude of the second phase preserving amplifier and a transmission gain amplitude of the first phase preserving amplifier is the same as a transmission gain amplitude of the second phase preserving amplifier; and the reflection gain amplitude of the first phase preserving amplifier is greater than or equal to unity and less than a reciprocal of a transmission amplitude of the second coupler.

17. The integrated circuit of claim 16, wherein:

the qubit is one of a plurality of qubits; and the low-noise directional amplifier is one of a plurality of low-noise directional amplifiers, each low-noise directional amplifier of the plurality of low-noise directional amplifiers connected to at least one of the plurality of qubits.

18. The integrated circuit of claim 16, wherein the low-noise directional amplifier is configured to measure the state of the qubit at the quantum noise limit.

19. The integrated circuit of claim 16, wherein the low-noise directional amplifier further comprises a third port coupled to a first cold load and a fourth port coupled to a second cold load.

20. The integrated circuit of claim 16, wherein the first parametric amplifier and the second parametric amplifier are each a Josephson Parametric Converter (JPC).

* * * * *